US007242733B2

(12) United States Patent
Iwata

(10) Patent No.: US 7,242,733 B2
(45) Date of Patent: Jul. 10, 2007

(54) CLOCK RECOVERY CIRCUIT

(75) Inventor: Toru Iwata, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 805 days.

(21) Appl. No.: 10/458,428

(22) Filed: Jun. 11, 2003

(65) Prior Publication Data

US 2003/0227310 A1 Dec. 11, 2003

(30) Foreign Application Priority Data

Jun. 11, 2002 (JP) ............................ 2002-169609

(51) Int. Cl.
*H04L 7/00* (2006.01)

(52) U.S. Cl. ...................... 375/355; 375/371; 375/375; 375/376; 331/57; 327/144

(58) Field of Classification Search ................ 375/355, 375/371, 373, 375, 376, 374; 327/144, 147; 331/57

See application file for complete search history.

(56) References Cited

U.S. PATENT DOCUMENTS

| | | | | |
|---|---|---|---|---|
| 6,373,911 | B1 * | 4/2002 | Tajima et al. | 375/375 |
| 6,559,727 | B2 * | 5/2003 | Boerstler | 331/57 |
| 6,584,163 | B1 * | 6/2003 | Myers et al. | 375/360 |
| 6,760,389 | B1 * | 7/2004 | Mukherjee et al. | 375/326 |
| 6,914,953 | B2 * | 7/2005 | Boerstler | 375/373 |
| 6,973,149 | B2 * | 12/2005 | Fyvie | 375/364 |
| 6,990,597 | B2 * | 1/2006 | Abe et al. | 713/500 |
| 2002/0047738 | A1 | 4/2002 | Kamihara | |

FOREIGN PATENT DOCUMENTS

| | | |
|---|---|---|
| CN | 1350234 A | 5/2002 |

OTHER PUBLICATIONS

"156 Mbps CMOS Clock Recovery Circuit for Burst-mode Transmission", Makoto Nakamura, et al., 1996 Symposium on VLSI Circuits Digest of Technical Papers, pp. 122-123.

* cited by examiner

*Primary Examiner*—Phuong Phu
(74) *Attorney, Agent, or Firm*—McDermott Will & Emery LLP

(57) ABSTRACT

The clock recovery circuit includes a first oscillator and an edge detector. The first oscillator generates a plurality of clocks having different phases and a predetermined frequency. The edge detector detects two clocks, among the plurality of clocks, between edges of which an input data signal has made a transition. The first oscillator includes a plurality of delay cells connected in a ring, and outputs of the plurality of delay cells are output as the plurality of clocks. Each of the plurality of delay cells selectively delays a first-delay added input data signal or the signal output from the preceding delay cell, and outputs the selected delayed signal. The edge detector controls one delay cell among the plurality of delay cells corresponding to the result of the detection, to delay and output the first-delay added input data signal.

28 Claims, 17 Drawing Sheets

CLOCK RECOVERY CIRCUIT

BACKGROUND OF THE INVENTION

The present invention relates to a clock recovery circuit, and more particularly, to a clock recovery circuit for extracting multiphase clocks synchronizing with data from the data.

For transmission/reception of data, a clock is necessary together with the data. The clock is a signal serving as a reference of timing for retrieval of the data. In data communications over some distance, such as data communications between mutually connected equipment units, if a data path and a clock path are provided separately, the phase relationship between the data and the clock set on the transmitter side may not be precisely received on the receiver side in some cases, due to a difference in path length and a difference in distortion level. As a result, high-speed data communications may not be attained. To solve this problem, a clock recovery technology is adopted in which a clock is extracted from transitions of data on the receiver side and recovered.

FIG. 17A shows a configuration of a conventional clock recovery circuit disclosed in Japanese Laid-Open Patent Publication No. 8-213979. The clock recovery circuit of FIG. 17A includes VCOs 100 and 101, a delay circuit 102 and logic circuits 103 and 104. The VCO 100 oscillates at a frequency corresponding to a bias voltage BIAS. The VCO 101 is identical in configuration to the VCO 100. The delay circuit 102 delays an asynchronous input data signal Data by a half period of the transmission rate. The logic circuit 103 computes exclusive OR of the input data signal Data and a signal from the delay circuit 102. In other words, the logic circuit 103 outputs low pulses having a width of a half period of the transmission rate of the input data signal Data. The logic circuit 104 computes AND of a signal output from the VCO 101 and a signal output from the logical circuit 103.

As shown in FIG. 17B, in the clock recovery circuit described above, the logic circuit 103 outputs a signal Gdat, which is put in an L level for a duration of a half of the transmission rate of the input data signal Data in response to a transition of the input data signal Data. The logic circuit 104 computes AND of a clock generated by the VCO 101 and the signal Gdat from the logic circuit 103, to thereby extract a clock ECK synchronizing with the asynchronous input data signal Data. With the configuration described above, the clock phase can be instantaneously locked with the input data as long as the VCO 101 has been locked at a predetermined frequency.

However, because the clock recovery circuit of FIG. 17A uses the single-phase clock ECK, the oscillating frequency of the VCO 101 must be equal to the data rate of the input data signal Data. In addition, because the logic circuit 104 is placed in the loop of the VCO 101, the upper limit of the acceptable data rate is defined by the sum of the total delay time of delay circuits constituting the VCO 101 and the delay time of the logic circuit 104. Therefore, this clock recovery circuit is not suitable for superfast data transmission.

SUMMARY OF THE INVENTION

An object of the present invention is providing a clock recovery circuit capable of supporting superfast data transmission.

According to one aspect of the present invention, the clock recovery circuit includes a first oscillator and an edge detector. The first oscillator generates a plurality of clocks having different phases and a predetermined frequency. The edge detector detects two clocks, among the plurality of clocks from the first oscillator, between edges of which an input data signal has made a transition. The first oscillator includes a plurality of delay cells connected in a ring, and outputs of the plurality of delay cells are output as the plurality of clocks. Each of the plurality of delay cells selectively delays a first-delay added input data signal or the signal output from the preceding delay cell, and outputs the selected delayed signal. The edge detector controls one delay cell among the plurality of delay cells corresponding to the result of the detection, to delay and output the first-delay added input data signal.

The clock recovery circuit described above detects two clocks, among the plurality of clocks from the first oscillator, between edges of which the input data signal has made a transition. The input of one delay cell among the plurality of delay cells of the first oscillator corresponding to the detection result is switched from the signal output from the preceding delay cell to the first-delay added input data signal. By this operation, a plurality of clocks (multiphase clocks) synchronizing with the input data signal are obtained.

By replacing a proper clock edge with a data edge every time a transition of the input data signal is detected, the phases of the multiphase clocks from the first oscillator are optimized. Therefore, the phase relationship between the input data signal and the multiphase clocks can be locked instantaneously with the start of data transmission, and this enables support of burst mode transmission.

By setting the phase interval of the plurality of clocks from the first oscillator to be equal to the data rate of the input data signal, the oscillating frequency of the first oscillator is 1/N of the data rate of the input data signal, where N is the number of stages of the delay cells included in the first oscillator. By this setting, the clock frequency is eased compared with the conventional clock recovery circuit, and thus higher-rate data transmission can be supported.

Preferably, the edge detector includes a plurality of delay path selectors provided to correspond to the plurality of delay cells. Each of the delay path selectors outputs to the corresponding delay cell a mask signal asserted for a predetermined period in response to a transition of the input data signal if this transition occurs between edges of corresponding two clocks among the plurality of clocks. Each of the plurality of delay cells delays the first-delay added input data signal and outputs the delayed signal when the mask signal from the corresponding delay path selector is active.

Preferably, the predetermined period includes: a transition point of the signal output from the delay cell preceding the delay cell corresponding to each of the plurality of delay path selectors; and a transition point of the first-delay added input data signal.

Preferably, each of the plurality of delay path selectors includes a latch circuit. The latch circuit latches a pulse signal asserted between edges of two clocks corresponding to each of the plurality of delay path selectors, in response to an edge of the input data signal, and the latch circuit resets the latched signal in response to a reset signal, the reset signal being delayed by a predetermined phase from the edges of the two clocks.

Preferably, the reset signal is synchronous with an edge of any clock among the plurality of clocks.

Preferably, the clock recovery circuit described above further includes a first delay circuit and a control circuit. The first delay circuit adds a second delay to the plurality of clocks from the first oscillator. The control circuit controls the delay amount of the second delay. Each of the plurality of delay path selectors outputs to the corresponding delay cell a mask signal asserted for a predetermined period in response to a transition of the input data signal if this transition occurs between edges of corresponding two clocks among the plurality of clocks with the second delay added by the first delay circuit.

Preferably, the control circuit feedback-controls the delay amount of the second delay so that the phase difference between first and second clocks is a predetermined value. The first clock is obtained by adding the second delay and a third delay to one clock among the plurality of clocks from the first oscillator. The delay amount of the third delay includes a delay amount generated in one delay path selector among the plurality of delay path selectors. The second clock is another clock among the plurality of clocks from the first oscillator.

Preferably, the control circuit sets the delay amount of the second delay discretely according to the data rate of the input data signal.

Preferably, the clock recovery circuit described above further includes a PLL circuit. The PLL circuit includes a second oscillator identical in configuration to the first oscillator. The second oscillator oscillates at a frequency corresponding to a first bias voltage. The PLL circuit feedback-controls the first bias voltage so that the oscillating frequency of the second oscillator is equal to a reference frequency. The first oscillator oscillates at a frequency corresponding to the first bias voltage.

Preferably, the edge detector includes a plurality of delay path selectors provided in correspondence with the plurality of delay cells of the first oscillator. Each of the delay path selectors outputs to the corresponding delay cell a mask signal asserted for a predetermined period in response to a transition of the input data signal if this transition occurs between edges of corresponding two clocks among the plurality of clocks from the first oscillator. Each of the plurality of delay cells of the first oscillator delays the first-delay added input data signal and outputs the delayed signal when the mask signal from the corresponding delay path selector is active.

Preferably, the clock recovery circuit described above further includes a first delay circuit and a control circuit. The first delay circuit adds a second delay to the plurality of clocks from the first oscillator and the plurality of clocks from the second oscillator. The control circuit controls the delay amount of the second delay. Each of the plurality of delay path selectors outputs to the corresponding delay cell of the first oscillator a mask signal asserted for a predetermined period in response to a transition of the input data signal if this transition occurs between edges of corresponding two clocks among the plurality of clocks from the first oscillator with the second delay added by the first delay circuit.

Preferably, the control circuit feedback-controls the delay amount of the second delay so that the phase difference between first and second clocks is a predetermined value. The first clock is obtained by adding the second delay and a third delay to one clock among the plurality of clocks from the second oscillator. The delay amount of the third delay includes a delay amount generated in one delay path selector among the plurality of delay path selectors. The second clock is another clock among the plurality of clocks from the second oscillator.

Preferably, the control circuit sets the delay amount of the second delay discretely according to the data rate of the input data signal.

Preferably, the clock recovery circuit described above further includes a frequency detector and a control signal generator. The frequency detector compares an oscillating frequency of the first oscillator with a reference frequency. The control signal generator outputs a control signal corresponding to the result of the comparison by the frequency detector. The first oscillator oscillates at a frequency corresponding to the control signal from the control signal generator.

Preferably, the clock recovery circuit described above further includes a thinning section for thinning edges of the input data signal. The edge detector detects two clocks, among the plurality of clocks, between edges of which the input data signal edge-thinned by the thinning section has made a transition. Each of the plurality of delay cells selectively delays a first-delay added input data signal edge-thinned by the thinning section or the signal output from the preceding delay cell, and outputs the selected delayed signal. The edge detector controls one delay cell among the plurality of delay cells corresponding to the result of the detection to delay the first-delay added input data signal edge-thinned by the thinning section and output the delayed signal.

Preferably, the thinning section includes a frequency divider for dividing the frequency of the input data signal.

According to another aspect of the present invention, the clock recovery circuit includes a multiphase clock generator, an edge detection section, a phase comparison section and a control circuit. The multiphase clock generator generates a plurality of clocks having different phases and a predetermined frequency. The edge detection section detects two clocks, among the plurality of clocks, between edges of which an input data signal has made a transition. The phase comparison section compares the phase of one clock among the plurality of clocks corresponding to the result of the detection by the edge detection section with the phase of a first-delay added input data signal obtained by adding a first delay to the input data signal. The control circuit controls the phases of the plurality of clocks according to the result of the comparison by the phase comparison section.

Preferably, the edge detection section includes a plurality of detection circuits. The phase comparison section includes a plurality of phase comparators provided to correspond to the plurality of detection circuits. Each of the plurality of detection circuits outputs to the corresponding phase comparator a mask signal asserted for a predetermined period in response to a transition of the input data signal if this transition occurs between edges of corresponding two clocks among the plurality of clocks. Each of the plurality of phase comparators compares the phase of the corresponding clock among the plurality of clocks with the phase of the first-delay added input data signal.

Preferably, each of the plurality of detection circuits includes a latch circuit. The latch circuit latches a pulse signal asserted between edges of the corresponding two clocks in response to an edge of the input data signal, and resets the latched signal in response to a reset signal, the reset signal being delayed by a predetermined phase from the edges of the corresponding two clocks.

Preferably, the reset signal is synchronous with an edge of any clock among the plurality of clocks.

Preferably, the multiphase clock generator includes a first oscillator. The first oscillator includes a plurality of delay cells connected in a ring, outputs of the plurality of delay cells being output as the plurality of clocks.

Preferably, the clock recovery circuit described above further includes a PLL circuit. The PLL circuit includes a second oscillator identical in configuration to the first oscillator. The second oscillator oscillates at a frequency corresponding to a first bias voltage and a second bias voltage. The PLL circuit feedback-controls the first bias voltage so that the oscillating frequency of the second oscillator is equal to a reference frequency. The control circuit outputs a third bias voltage corresponding to the result of the comparison by the phase comparison section. The first oscillator oscillates at a frequency corresponding to the first bias voltage and the third bias voltage.

Preferably, the second bias voltage is set at an intermediate voltage between the supply voltage and the ground voltage.

Preferably, the clock recovery circuit described above further includes a frequency detector and a control signal generator. The frequency detector compares an oscillating frequency of the first oscillator with a reference frequency. The control signal generator outputs a control signal corresponding to the result of the comparison by the frequency detector. The first oscillator oscillates at a frequency corresponding to the control signal from the control signal generator.

Preferably, clock recovery circuit described above further includes a first delay circuit and a second delay circuit. The first delay circuit adds a second delay to the input data signal. The second delay circuit adds a third delay to the plurality of clocks from the multiphase clock generator. The edge detection section detects two clocks, among the plurality of third-delay added clocks, between edges of which the second-delay added input data signal has made a transition. The phase comparison section compares the phase of one clock among the plurality of third-delay added clocks corresponding to the result of the detection by the edge detector with the phase of a signal obtained by adding the first delay and the second delay to the input data signal. The control circuit controls the delay amount of the second delay and/or the delay amount of the third delay according to the result of the comparison by the phase comparison section.

Preferably, the multiphase clock generator includes a plurality of stages of delay cells and a delay control section, and outputs of the plurality of stages of delay cells are output as the plurality of clocks. A reference clock is supplied to an input of the first-stage delay cell among the plurality of stages of delay cells. The delay control section compares the phase of the output of the final-stage delay cell among the plurality of stages of delay cells with the reference clock, and controls the delay amount of the plurality of stages of delay cells according to the result of the comparison.

Preferably, clock recovery circuit described above further includes a thinning section for thinning edges of the input data signal. The edge detection section detects two clocks, among the plurality of clocks, between edges of which the input data signal edge-thinned by the thinning section has made a transition. The phase comparison section compares the phase of one clock among the plurality of clocks corresponding to the result of the detection by the edge detection section with the phase of a first-delay added input data signal edge-thinned by the thinning section.

Preferably, the thinning section includes a frequency divider for dividing the frequency of the input data signal.

DESCRIPTION OF THE PREFERRED EMBODIMENTS

Figure 1A:
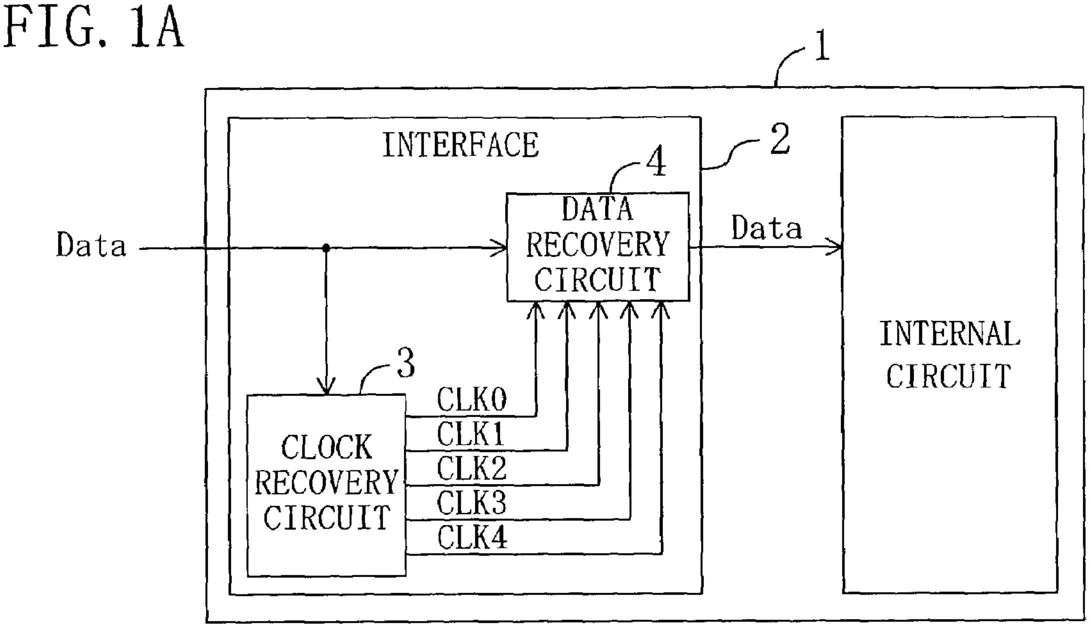
FIG. 1A is a block diagram showing a schematic configuration of electronic communication equipment in Embodiment 1 of the present invention.

Hereinafter, preferred embodiments of the present invention will be described with reference to the accompanying drawings. Throughout the drawings, the same components are denoted by the same reference numerals, and the description thereof is not repeated.

Embodiment 1

<Schematic configuration of electronic communication equipment>

Figure 1B:
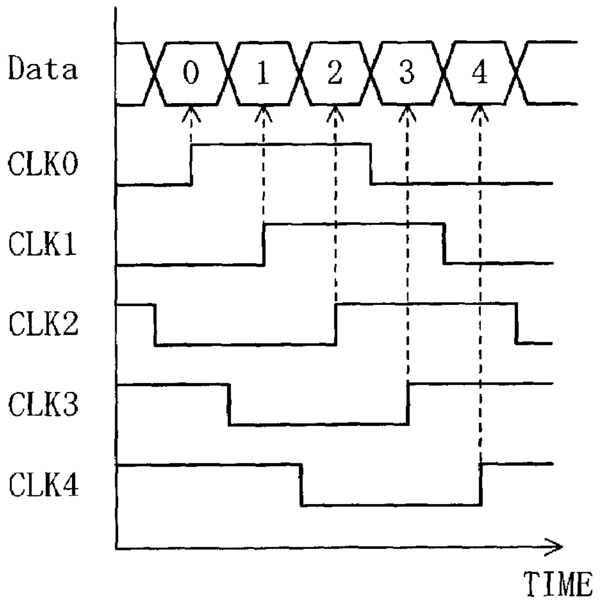
FIG. 1B is a timing chart demonstrating data recovery by a data recovery circuit.

FIG. 1A shows a schematic configuration of electronic communication equipment in Embodiment 1 of the present invention. In this electronic communication equipment, denoted by 1, an input data signal Data from outside is supplied to an internal circuit via an interface 2. The interface 2 includes a clock recovery circuit 3 and a data recovery circuit 4. The clock recovery circuit 3 extracts multiphase clocks CLK0 to CLK4 synchronizing the input data signal Data from the input data signal Data. The phase interval (phase difference) of the multiphase clocks CLK0 to CLK4 is equal to the data width defined by the data rate of the input data signal Data. The data recovery circuit 4 recovers the input data signal Data with the multiphase clocks CLK0 to CLK4 sent from the clock recovery circuit 3. Specifically, as shown in FIG. 1B, the data recovery circuit 4 recovers one data unit of the input data signal Data at each edge of the phases of the multiphase clocks CLK0 to CLK4. The input data signal Data recovered by the data recovery circuit 4 is supplied to the internal circuit.

<Internal configuration of clock recovery circuit 3>

Figure 2:
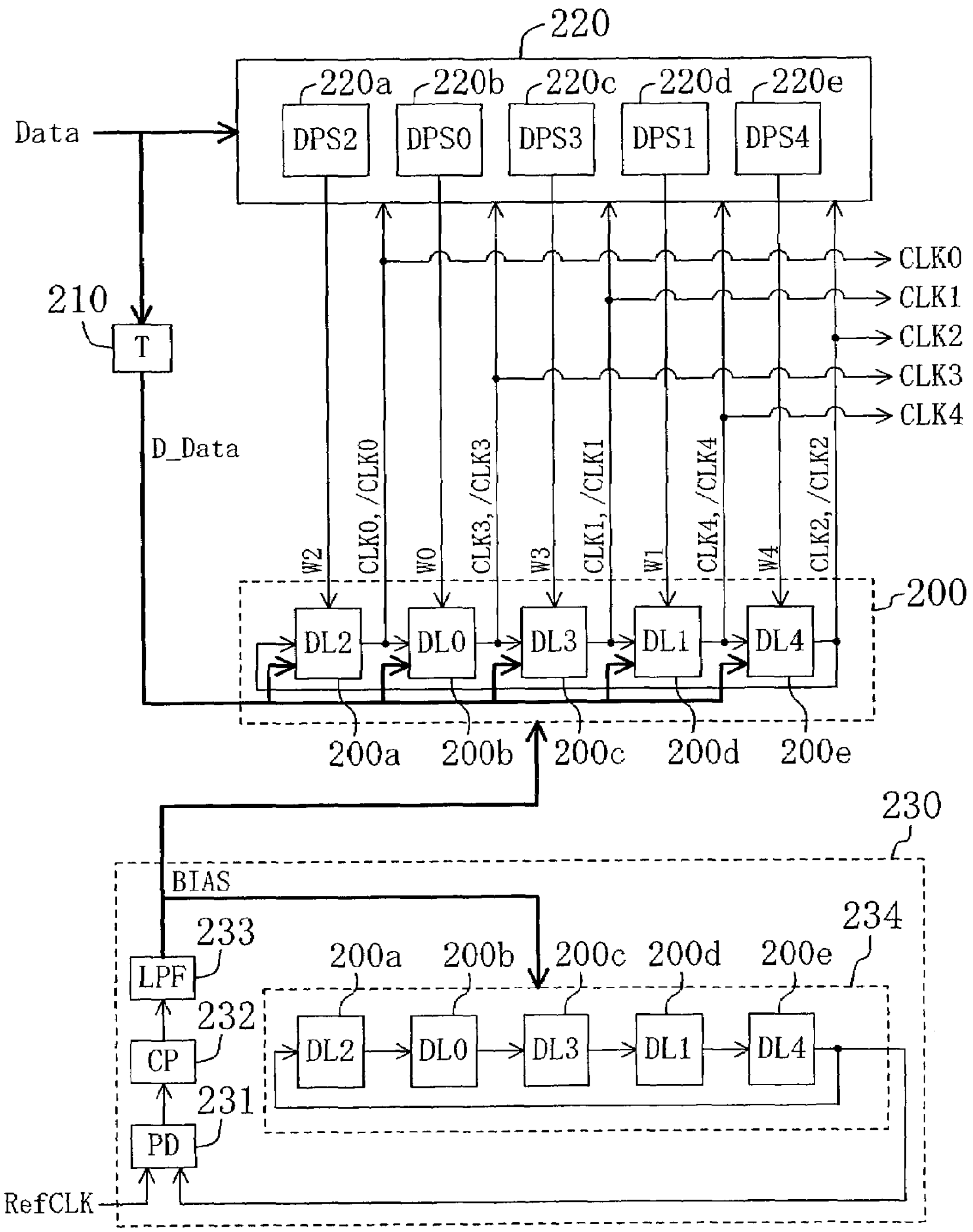
FIG. 2 is a block diagram of a clock recovery circuit shown in FIG. 1A.

FIG. 2 shows an internal configuration of the clock recovery circuit 3 shown in FIG. 1. The clock recovery circuit 3 includes a voltage-controlled oscillator (VCO) 200, a delay circuit 210, an edge detector 220 and a PLL 230.

The delay circuit 210 delays the input data signal Data by time T corresponding to the data width defined by the data rate of the input data signal Data.

The VCO 200, oscillating at a frequency corresponding to a bias voltage BIAS from the PLL 230, includes 5-stage delay cells 200*a* to 200*e* connected in a ring. Each of the delay cells 200*a* to 200*e* selectively delays a signal output from the preceding delay cell or an input data signal D_Data from the delay circuit 210, and outputs the selected delayed signal. More specifically, each of the delay cells 200*a* to 200*e* selects a signal output from the preceding delay cell or the input data signal D_Data from the delay circuit 210 in response to a corresponding mask signal among mask signals W0 to W4 from the edge detector 220, and delays the selected signal by a delay amount corresponding to the bias voltage BIAS. The outputs (CLK0, CLK3, CLK1, CLK4, CLK2) of the delay cells 200*a* to 200*e* are output outside the clock recovery circuit 3 as the multiphase clocks CLK0 to CLK4.

The edge detector 220 detects two clocks, among the multiphase clocks CLK0 to CLK4, between the edges of which the input data signal Data has made a transition. The edge detector 220 also sends the mask signals W0 to W4 to the delay cells 200*a* to 200*e* of the VCO 200. According to the result of the above detection, the edge detector 220 asserts one of the mask signals W0 to W4 for a predetermined duration. More specifically, the edge detector 220 includes delay path selectors 220*a* to 220*e* respectively corresponding to the delay cells 200*a* to 200*e* of the VCO 200, and these path selectors 220*a* to 220*e* send the mask signals W2, W0, W3, W1, W4 to the corresponding delay cells 200*a* to 200*e*. Each of the path selectors 220*a* to 220*e* asserts the mask signal for a predetermined duration when a transition of the input data signal Data occurs between the edges of the corresponding two clocks among the multiphase clocks CLK0 to CLK4 sent from the VCO 200.

The PLL 230 includes a phase comparator 231, a charge pump 232, a low-pass filter 233 and a voltage-controlled oscillator (VCO) 234. The phase comparator 231: outputs an error signal corresponding to the phase difference between the output of the VCO 234 and a reference clock RefCLK. The charge pump 232 outputs a voltage corresponding to the error signal from the phase comparator 231. The low-pass filter 233 removes high frequency components of the voltage from the charge pump 232 and outputs the resultant voltage as the bias voltage BIAS. The VCO 234 is identical in configuration to the VCO 200. That is, the VCO 234 includes 5-stage delay cells 200*a* to 200*e* connected in a ring, and therefore has the same oscillating frequency as the VCO 200. Note however that each of the delay cells 200*a* to 200*e* of the VCO 234 invariably delays the output of the preceding delay cell by a delay amount corresponding to the bias voltage BIAS output from the low-pass filter 233. The output of the delay cell 200*e* of the VCO 234 is sent to the phase comparator 231.

As described above, the oscillating frequency of the VCO 200 is controlled with the bias voltage BIAS from the PLL 230. In the illustrated example, the frequency of the reference clock RefCLK is set at one-fifth of the data rate of the input data signal Data. By this setting, the phase interval of the 5-phase clocks CLK0 to CLK4 from the VCO 200 is equal to the data width defined by the data rate of the input data signal Data.

<Internal configuration of delay cells 200*a* to 200*e*>

The internal configuration of the delay cells 200*a* to 200*e* of the VCO 200 shown in FIG. 2 will be described. Herein, the description is made taking the delay cell 200*a* as an example.

Figure 3:
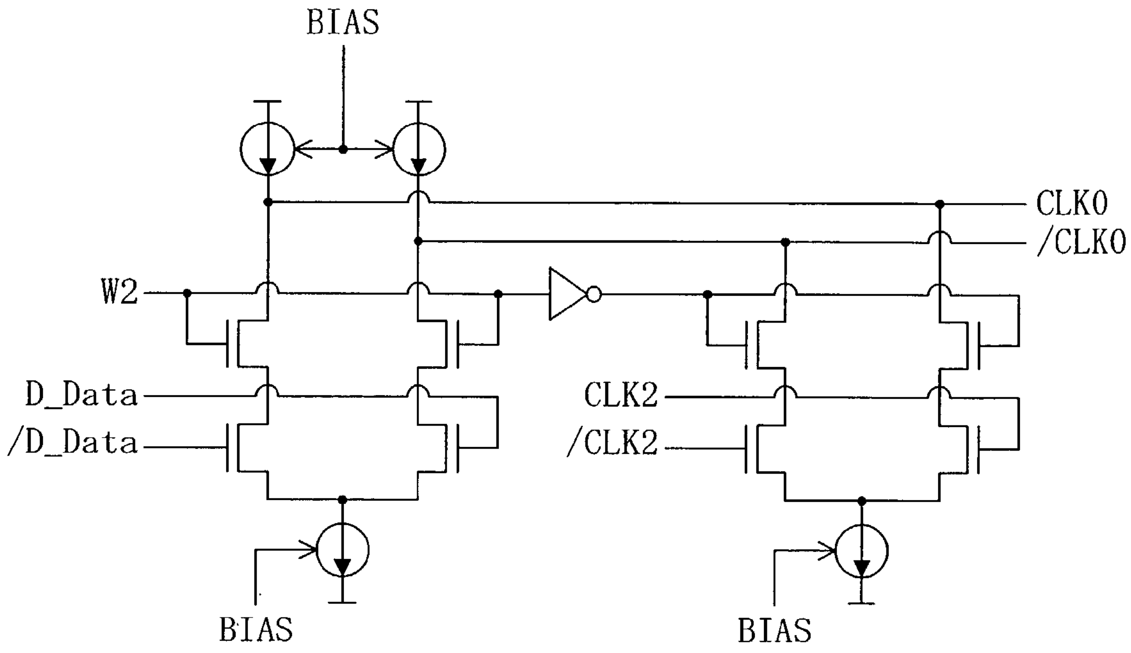
FIG. 3 is a view showing an internal configuration of a delay cell shown in FIG. 2.

As shown in FIG. 3, the delay cell 200*a* is a differential type voltage-controlled delay circuit. The delay cell 200*a* switches its input according to the mask signal W2. Specifically, when the mask signal W2 is in an H level (active), the delay cell 200*a* delays the input data signal (D_Data, D_Data) by a delay amount corresponding to the bias voltage BIAS and outputs the delayed signal as the clock (CLK0, /CLK0). When the mask signal W2 is in an L level (inactive), the delay cell 200*a* reverse-delays the output (CLK2, /CLK2) of the preceding delay cell 200*e* by a delay amount corresponding to the bias voltage BIAS and outputs the delayed signal as the clock (CLK0, /CLK0).

The delay cells 200*b* to 200*e* of the VCO 200 have substantially the same internal configuration as the delay cell of FIG. 3. The delay cells 200*a* to 200*e* of the VCO 234 also have substantially the same internal configuration as the delay cell of FIG. 3, except that each of the delay cells 200*a* to 200*e* of the VCO 234 invariably receives an L-level (inactive) signal in place of the mask signal, and therefore reverse-delays the output of the preceding delay cell invariably and outputs the resultant signal.

<Internal configuration of delay path selectors 220*a* to 220*e*>

The internal configuration of the delay path selectors 220*a* to 220*e* shown in FIG. 2 will be described. Herein, the description is made taking the delay path selector 220*e* as an example.

Figure 4A:
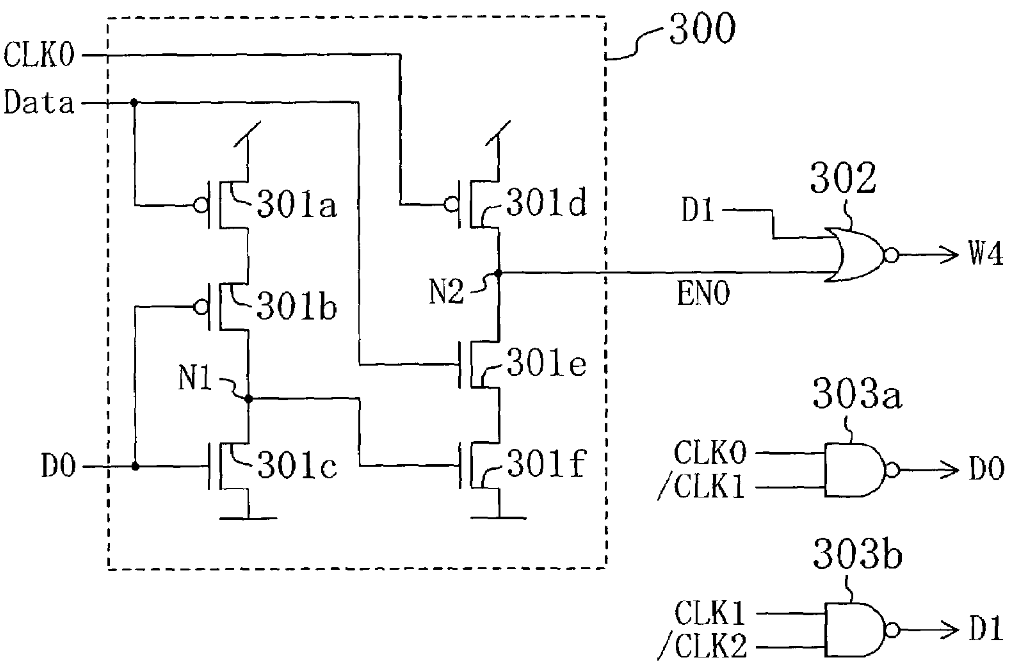
FIG. 4A is a view showing an internal configuration of a delay path selector shown in FIG. 2.

As shown in FIG. 4A, the delay path selector 220*e* includes a latch circuit 300, a NOR circuit 302 and NAND circuits 303*a* and 303*b*. The latch circuit 300 includes MOS transistors 301*a* to 301*f*.

A signal DO from the NAND circuit 303*a* is sent to the gates of the P-channel MOS transistor 301*b* and the N-channel MOS transistor 301*c* of the latch circuit 300. The signal D0 is put in an L level (active) during the period between the rising edge of the clock CLK0 and the rising edge of the clock CLK1.

When the signal D0 is in an H level (inactive), the potential of a node N1 is kept in an L level, irrespective of the level of the input data signal Data.

When the signal D0 is in the L level (active), the potential of the node N1 is kept in the immediately preceding state if the input data signal Data is in an H level, or becomes an H level if the input data signal Data is in an L level.

In other words, the potential of the node N1 becomes the H level only when the signal D0 is in the L level and the input data signal Data is in the L level. The H-level potential of the node N1 is retained irrespective of the level of the input data signal Data as long as the signal D0 is in the L level. Once the signal D0 becomes the H level, however, the potential of the node N1 becomes the L level.

When the clock CLK0 is in an L level, the signal D0 is in the H level. This puts the potential of node N1 in the L level, and thus the N-channel MOS transistor 301*f* is OFF. Also, during the L level of the clock CLK0, the P-channel MOS transistor 301*d* is ON. Accordingly, the potential EN0 of a node N2 is in an H level during the L level of the clock CLK0.

When the signal D0 is in the L level, the clock CLK0 is in an H level. During the H level of the clock CLK0, the P-channel MOS transistor 301*d* is OFF. Therefore, when both the N-channel MOS transistors 301*e* and 301*f* are turned ON during the L level of the signal D0, the potential EN0 of the node N2 changes to an L level.

Specifically, when both the signal D0 and the input data signal Data are in the L level, the potential of the node N1 is in the H level, and thus the N-channel MOS transistor 301*f* is ON. When the input data signal Data makes an L to H level transition during the L level of the signal D0, the N-channel MOS transistor 301*e* is turned ON. Since the signal D0 remains in the L level, the potential of the node N1 is kept in the H level. Thus, with both the N-channel MOS transistors 301*e* and 301*f* being ON, the potential EN0 of the node N2 changes to the L level. Thereafter, when the signal D0 makes a transition to the H level, the potential of the node N1 becomes the L level, and thus the node N2 is put in an open state irrespective of the potential of the input data signal Data. When the clock CLK0 is in the H level, the potential EN0 of the node N2 is kept in the L level. Once the clock CLK0 makes an H to L level transition, the P-channel MOS transistor 301*d* is turned ON, and this changes the potential EN0 of the node N2 to the H level.

Figure 4B:
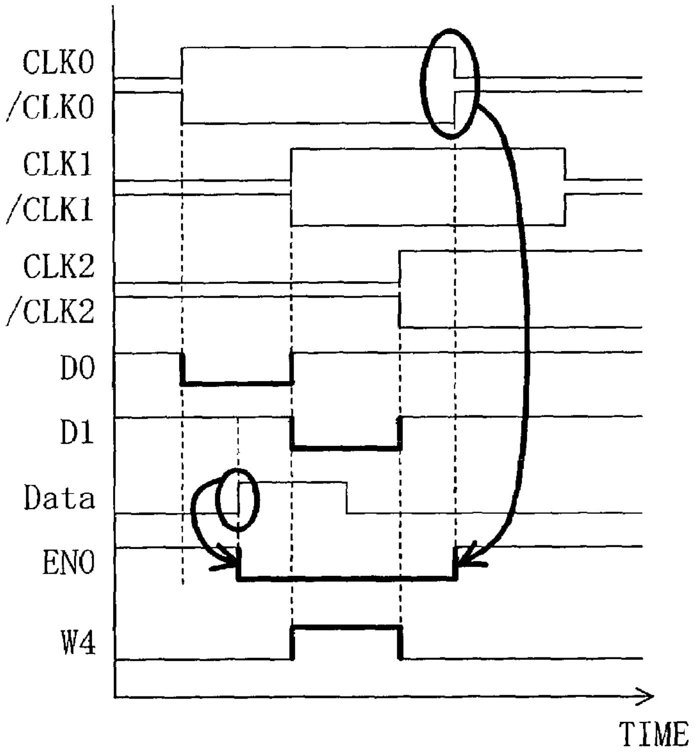
FIG. 4B is a timing chart showing the operation of the delay path selector of FIG. 4A.

As shown in FIG. 4B, in the delay path selector 200*e*, during the period between the rising edge of the clock CLK0 and the rising edge of the clock CLK1 (during the L level of the signal D0), when the input data signal Data makes an L to H level transition, a negative logic pulse (EN0) is output from the node N2. The falling of this pulse is synchronous with the rising edge of the input data signal Data, and the rising thereof is synchronous with the falling edge of the clock CLK0.

A signal D1 from the NAND circuit 303*b* is put in an L level (active) during the period between the rising edge of the clock CLK1 and the rising edge of the clock CLK2. The period during which the potential EN0 of the node N2 is in the L level includes the period of the L level of the signal D1. Therefore, the mask signal W4 as the output of the NOR circuit 302 is asserted (becomes an H level) only when the input data signal Data has made an L to H level transition during the period between the rising edge of the clock CLK0 and the rising edge of the clock CLK1. The period during which the mask signal W4 is asserted is equal to the period of the L level (active) of the signal D1.

As described above, when the input data signal Data makes an L to H level transition during the period between the rising edges of the clocks CLK0 and CLK1 from the VCO 200, the delay path selector 220*e* asserts the mask signal W4 (raises to the H level) in response to this transition.

The delay path selectors 220*a* to 220*d* have substantially the same internal configuration as the delay path selector 220*e* shown in FIG. 4A. Specifically, the delay path selector 220*a* asserts the mask signal W2 (raises to the H level) in response to an L to H level transition of the input data signal Data when this transition occurs during the period between the rising edges of the clocks CLK3 and CLK4 from the VCO 200. The delay path selector 220*b* asserts the mask signal W0 (raises to the H level) in response to an L to H level transition of the input data signal Data when this transition occurs during the period between the rising edges of the clocks CLK1 and CLK2 from the VCO 200. The delay path selector 220*c* asserts the mask signal W3 (raises to the H level) in response to an L to H level transition of the input data signal Data when this transition occurs during the period between the rising edges of the clocks CLK4 and CLK0 from the VCO 200. The delay path selector 220*d* asserts the mask signal W1 (raises to the H level) in response to an L to H level transition of the input data signal Data when this transition occurs during the period between the rising edges of the clocks CLK2 and CLK3 from the VCO 200.

<Operation of clock recovery circuit 3>

Figure 5:
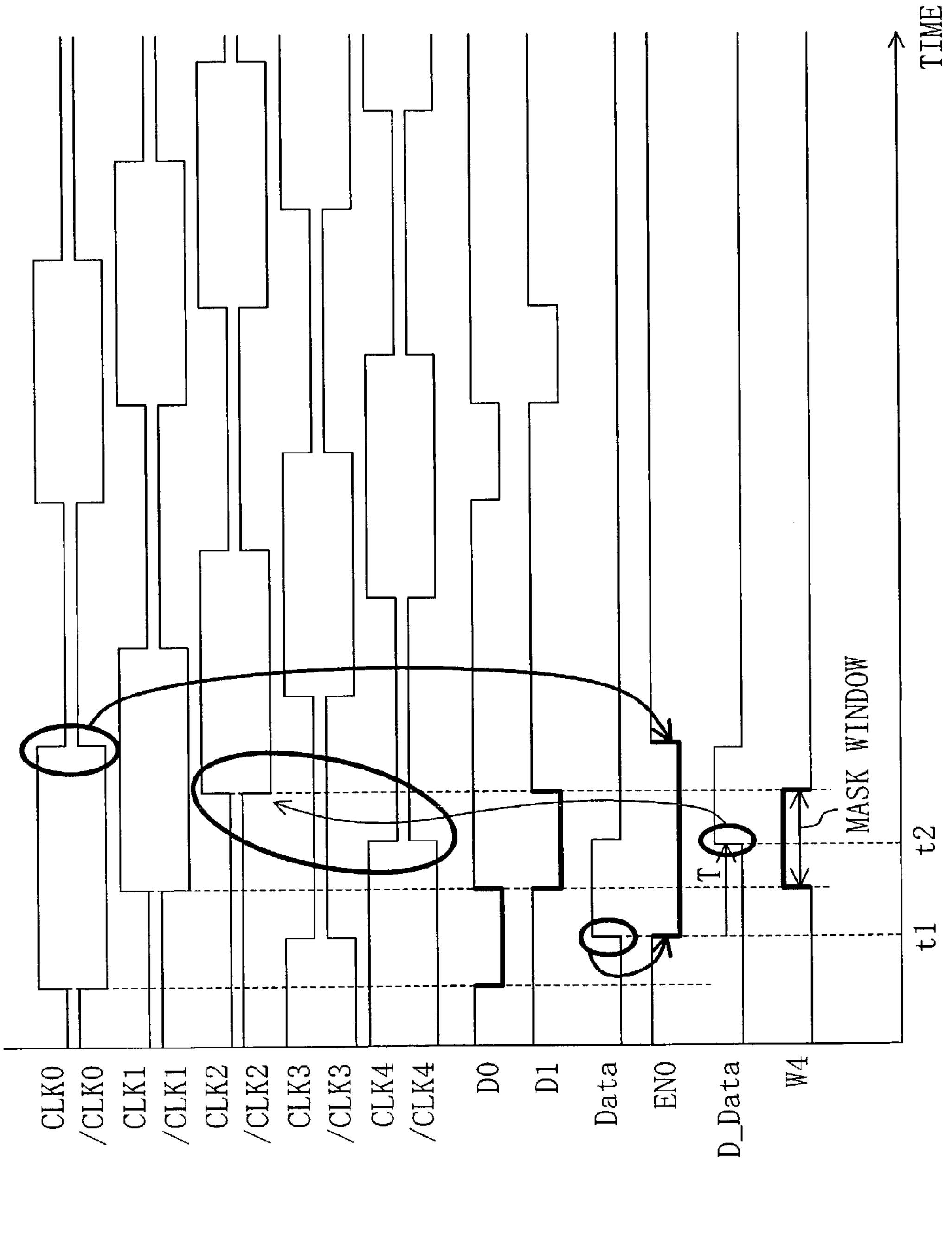
FIG. 5 is a timing chart showing the operation of the clock recovery circuit of FIG. 2.

The operation of the clock recovery circuit 3 of FIG. 2 will be described with reference to FIG. 5.

At time t1, the input data signal Data makes an L to H level transition. The time t1 is included in the period during which the signal D0 is in the L level (active), that is, the period between the rising edges of the clocks CLK0 and CLK1 from the VCO 200. In response to the transition of the input data signal Data at time t1, the delay path selector 220*e* turns the potential EN0 of the node N2 to the L level. The delay path selector 220*e* then asserts the mask signal W4 (raises to the H level) during the period from the rising of the clock CLK1 until the rising of the clock CLK2 (the period during which the signal D1 is in the L level), which is included in the period during which the potential EN0 of the node N2 is in the L level. Upon receipt of the active mask signal W4, the delay cell 200*e* of the VCO 200 switches its input from the output CLK4 of the delay cell 200*d* preceding the delay cell 200*e* to the input data signal D_Data. The active period (mask window) of the mask signal W4 includes a transition point of the output CLK4 of the preceding delay cell 200*d*, which is located at the center of the mask window. Therefore, the transition point of the output CLK4 of the delay cell 200*d* is masked by the mask window.

At time t2, the input data signal D_Data from the delay circuit 210 makes an L to H level transition. The time t2 is included in the active period (mask window) of the mask signal W4. The output CLK2 of the delay cell 200*e* therefore makes a transition in response to the transition of the input data signal D_Data at time t2. This indicates that the edge of the output CLK4 of the delay cell 200*d* preceding the delay cell 200*e* is replaced with the edge of the input data signal D_Data. In other words, the transition time of the output CLK2 of the delay cell 200*e* is defined by the input data signal D_Data. This enables fixation of the phase relationship between the clock edge and the edge of the input data signal Data at and after the transition time of the output CLK2. In this way, the multiphase clocks CLK0 to CLK4 synchronizing with the input data signal Data are obtained.

In this embodiment, the case that the input data signal Data made a transition during the period between the rising edges of the clocks CLK0 and CLK1 among the 5-phase clocks CLK0 to CLK4 was described. When the input data signal Data makes a transition during a period between other clock edges, also, the multiphase clocks CLK0 to CLK4 synchronizing with the input data signal Data can be obtained in a manner similar to that described above.

<Effect>

As described above, the clock discovery circuit 3 of Embodiment 1 detects two clocks, among the multiphase clocks CLK0 to CLK4, between the edges of which the input data signal Data has made an L to H level transition. The input of the delay cell among the delay cells 200*a* to 200*e* corresponding to the result of the detection is switched from the signal output from the preceding delay cell to the input data signal D_Data. In this way, the multiphase clocks CLK0 to CLK4 synchronizing with the input data signal Data are obtained.

Every time a transition of the input data signal Data is detected, a proper clock edge is replaced with the data edge, to thereby optimize the phases of the multiphase clocks CLK0 to CLK4 (synchronize the multiphase clocks CLK0 to CLK4 with the input data signal Data). Therefore, the phase relationship between the input data signal Data and the multiphase clocks CLK0 to CLK4 can be locked instantaneously with the start of data transmission, and this enables support of burst mode transmission.

Figure 17A:
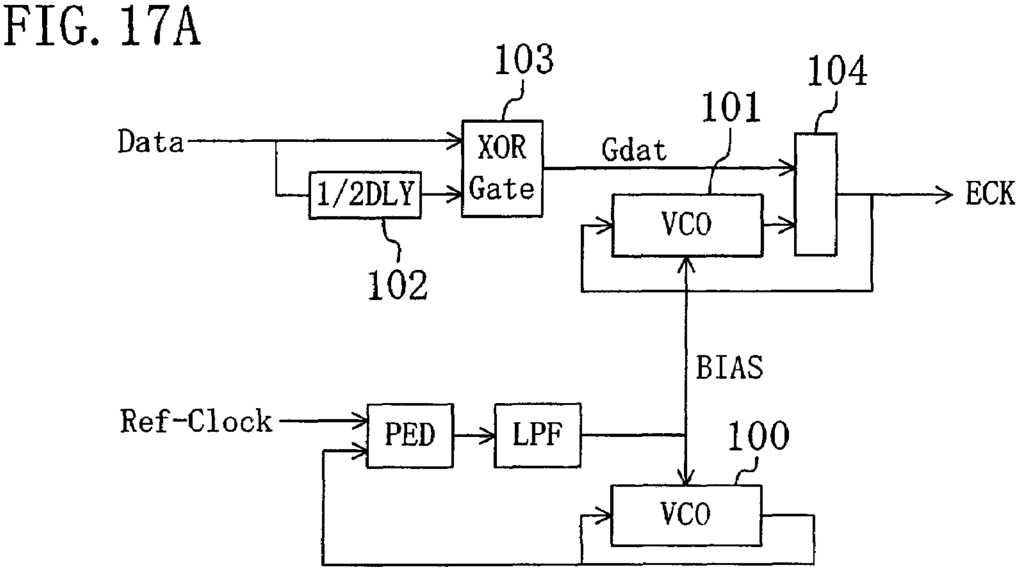
FIG. 17A is a block diagram of a conventional clock recovery circuit.
Figure 17B:
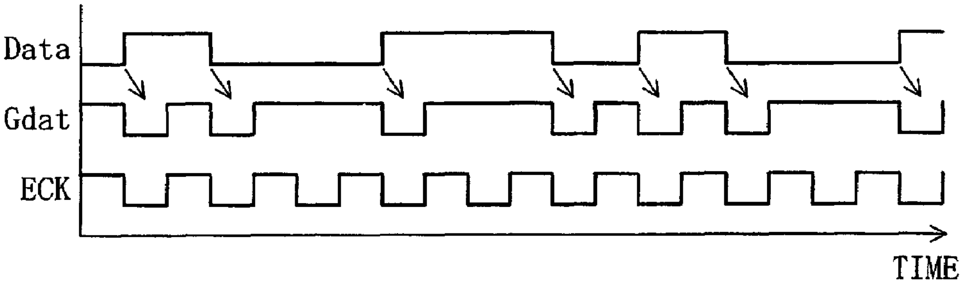
FIG. 17B is a timing chart showing the operation of the clock recovery circuit of FIG. 17A.

Since the phase interval of the 5-phase clocks CLK0 to CLK4 from the VCO 200 is made equal to the data rate of the input data signal Data, the oscillating frequency of the VCO 200 is one-fifth of the data rate of the input data signal Data. This eases the clock frequency compared with the case of the conventional clock recovery circuit shown in FIG. 17, and thus higher-rate data transmission can be supported.

The clock recovery circuit 3 of Embodiment 1 can support a data rate satisfying the condition that the delay amount settable for each of the delay cells 200*a* to 200*e* of the VCO 200 is smaller than the data width defined by the data rate. Contrarily, a 3X oversampling type clock recovery circuit supports a data rate satisfying the condition that the amount three times as large as the delay amount settable for a delay circuit of a VCO is smaller than the data width defined by the data rate. In other words, the clock recovery circuit 3 of Embodiment 1 can support a data rate three times as high as that the 3X oversampling type clock recovery circuit can support.

<Alterations>

In this embodiment, the frequency of the reference clock RefCLK was set at one-fifth of the data rate of the input data signal Data so that the phase interval of the 5-phase clocks CLK0 to CLK4 from the VCO 200 was equal to the data rate of the input data signal Data. The frequency of the reference clock RefCLK can be set at a desired value by placing a frequency divider on a path through which the output of the VCO 234 is input into the phase comparator 231 and/or a path through which the reference clock RefCLK is input into the phase comparator 231.

The oscillating frequency of the VCO 200 is not completely identical to the oscillating frequency of the VCO 234 due to a variation in the properties of MOS transistors, the position dependency of the fluctuation of the bias voltage BIAS and the like. Also, if the source of the reference clock RefCLK is different from that of the input data signal Data, the frequency of the reference clock RefCLK is deviated slightly from a predetermined value with respect to the transfer rate of the input data signal Data. This causes a failure of matching between the data rate of the input data signal Data and the oscillating frequency of the VCO 200. However, in the clock recovery circuit 3 of FIG. 2, the phases of the multiphase clocks CLK0 to CLK4 are optimized every time a transition of the input data signal Data is detected. Therefore, the locked state between the input data signal Data and the multiphase clocks CLK0 to CLK4 can be maintained as long as transition of the input data signal Data occurs at a frequency of a certain level or higher. For example, even when the oscillating frequency of the VCO 200 is deviated by 1% with respect to the data rate of the input data signal Data, the locked state can be maintained theoretically as long as transition of the input data signal Data occurs at a frequency of once every 50 bits or higher.

In this embodiment, the number of stages of the delay cells in the VCO 200 was set at five to obtain five phases of clocks output from the VCO 200, but it is not limited to this number. The VCO 200 may be constructed of an arbitrary number of stages of delay cells as long as adjustment is made so that an L to H level transition point of the input data signal D_Data from the delay circuit 210 and a transition point of the signal output from the delay cell preceding a given delay cell are included in the active period (mask window) of the mask signal to be sent to the given delay cell.

In this embodiment, the phase interval of the multiphase clocks CLK0 to CLK4 was set equal to the data rate of the input data signal Data. It is also possible to set the phase interval of the multiphase clocks CLK0 to CLK4 to an integer submultiple of the time defined by the data rate of the input data signal Data.

Each of the delay path selectors 220*a* to 220*e*, representatively shown in FIG. 4A, reacts to an L to H level transition of the input data signal Data occurring during the period between the edges of corresponding two clocks. By exchanging the P-channel MOS transistors and the N-channel MOS transistors with each other and reversing the input signal in the configuration of FIG. 4A, it is possible to provide delay path selectors reacting to an H to L level transition of the input data signal Data occurring during the period between the edges of corresponding two clocks. If these two types of delay path selectors are combined, the locked state can be maintained even when the transition density of the input data signal Data is lower.

In general, in high-speed serial data communications that requires the clock recovery circuit 3 described above, data is transmitted as differential signals. Therefore, it is possible to generate a signal complementary to a data signal at a correct timing. If a signal complementary to the input data signal Data is input into the delay path selector of FIG. 4A, the delay path selector will also react to an H to L level transition of the input data signal Data. Therefore, the locked state can be maintained even when the transition density of the input data signal Data is lower.

In this embodiment, the width of the mask window (active period of the mask signal) was made equal to the data width defined by the data rate of the input data signal Data. The mask window is only required to include a clock edge to be replaced and not to include its preceding and following clock edges. Therefore, although the mask signal W4 was used for replacement of the edge of the clock CLK4 in FIG. 5, the signal EN0 may be used in place of the mask signal W4.

Embodiment 2

In the clock recovery circuit of Embodiment 1, the mask window is desirably generated so that a transition point of the output of the preceding delay cell (that is, the clock to be replaced) is included in the mask window and located at the center thereof.

In Embodiment 1, however, no consideration is given to delays generated in the delay path selectors 220*a* to 220*e* during generation of the mask signals W0 to W4. For example, in the delay path selector 220*e* of FIG. 4A, a gate delay (delay amount tg1) is generated in the NAND circuits 303*a* and 303*b* during generation of the signals D0 and D1 from the clocks CLK0 and /CLK21 and the clocks CLK1 and /CLK2. Likewise, a gate delay (delay amount tg2) is generated in the NOR circuit 302 during generation of the mask signal W4 from the signals D1 and EN0. These delays are also generated in the delay path selectors 220*a* to 220*d.*

The influence of the delays described above is greater as the data rate of the input data signal Data is higher, and this will make it difficult to set the mask window at an optimum position. Embodiment 2 aims at suppressing the influence of the delays.

<Configuration of clock recovery circuit>

Figure 6:
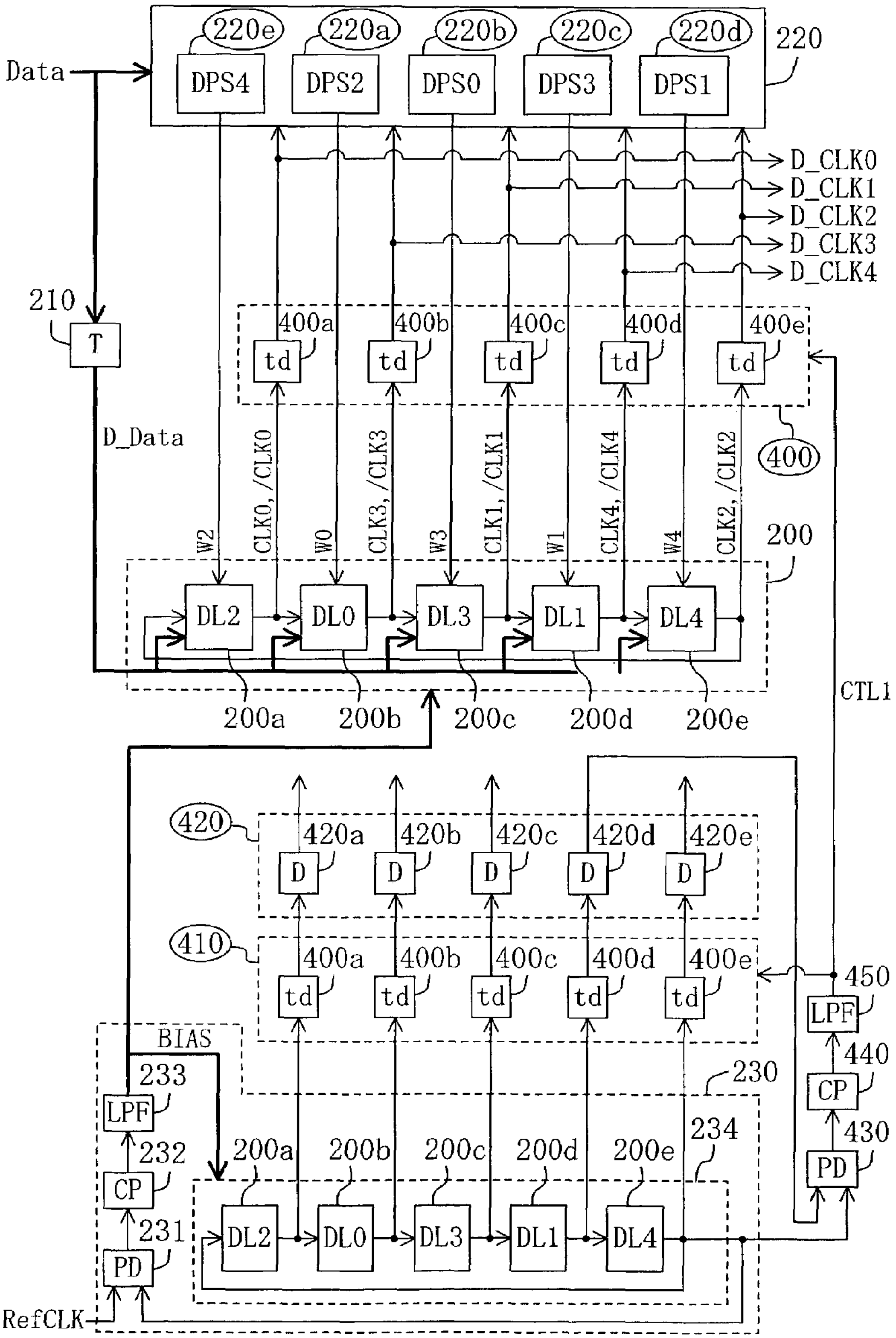
FIG. 6 is a block diagram of a clock recovery circuit of Embodiment 2 of the present invention.

FIG. 6 shows a configuration of a clock recovery circuit of Embodiment 2. The clock recovery circuit of this embodiment includes delay blocks 400, 410 and 420, a phase comparator 430, a charge pump 440 and a low-pass filter 450, in addition to the configuration of the clock recovery circuit of FIG. 2.

The delay block 400 includes delay circuits 400*a* to 400*e*: The delay circuits 400*a* to 400*e* delay the outputs of the delay cells 200*a* to 200*e* of the VCO 200, respectively, by a delay amount td corresponding to a control signal CTL1, and send the delayed signals to the edge detector 220. In other words, the delay circuits 400*a* to 400*e* add the delay amount td to the 5-phase clocks CLK0 to CLK4 from the VCO 200. The outputs (D_CLK0, D_CLK3, D_CLK1, D_CLK4 and D_CLK2) of the delay circui 400*e* of the delay block 400 are output externally as multiphase clocks D_CLK0 to D_CLK4.

The delay block 410 is identical in configuration to the delay block 400, that is, it has delay circuits 400*a* to 400*e*. The delay circuits 400*a* to 400*e* of the delay block 410 delay the outputs of the delay cells 200*a* to 200*e* of the VCO 234, respectively, by the delay amount td corresponding to the control signal CTL1, and send the delayed signals to the delay block 420.

The delay block 420 includes delay circuits 420*a* to 420*e*. The delay circuits 420*a* to 420*e* add a delay amount D to the outputs of the delay circuits 400*a* to 400*e* of the delay block 410. The delay amount D corresponds to the delay amount generated during generation of the mask signal in the delay path selectors 220*a* to 220*e*, where D=tg1+tg2.

The phase comparator 430 outputs an error signal corresponding to the phase difference between the output of the delay circuit 420*d* of the delay block 420 and the output of the delay cell 200*e* of the VCO 234. The charge pump 440 outputs a voltage corresponding to the error signal from the phase comparator 430. The low-pass filter 450 removes high frequency components of the voltage from the charge pump 440 and outputs the resultant voltage as the control signal CTL1. The control signal CTL1 is sent to the delay blocks 400 and 410.

In the clock recovery circuit of this embodiment, the correspondence between the delay path selectors 220*a* to 220*e* and the delay cells 200*a* to 200*e* of the VCO 200 is different from that in Embodiment 1. In this embodiment, the delay path selectors 220*a* to 220*e* correspond to the delay cells 200*b* to 200*e* and 200*a*, respectively.

The delay path selector 220*e* sends the mask signal W2 to the delay cell 200*a* of the VCO 200, and asserts the mask signal W2 (raises to an H level) in response to an L to H level transition of the input data signal Data when this transition occurs between the rising edge of the clock D_CLK0 from the delay circuit 400*a* of the delay block 400 and the rising edge of the clock D_CLK1 from the delay circuit 400*c* of the delay block 400.

The delay path selector 220*a* sends the mask signal W0 to the delay cell 200*b* of the VCO 200, and asserts the mask signal W0 (raises to an H level) in response to an L to H level transition of the input data signal Data when this transition occurs between the rising edge of the clock D_CLK3 from the delay circuit 400*b* of the delay block 400 and the rising edge of the clock D_CLK4 from the delay circuit 400*d* of the delay block 400.

The delay path selector 220*b* sends the mask signal W3 to the delay cell 200*c* of the VCO 200, and asserts the mask signal W3 (raises to an H level) in response to an L to H level transition of the input data signal Data when this transition occurs between the rising edge of the clock D_CLK1 from the delay circuit 400*c* of the delay block 400 and the rising edge of the clock D_CLK2 from the delay circuit 400*e* of the delay block 400.

The delay path selector 220*c* sends the mask signal W1 to the delay cell 200*d* of the VCO 200, and asserts the mask signal W1 (raises to an H level) in response to an L to H level transition of the input data signal Data when this transition occurs between the rising edge of the clock D_CLK4 from the delay circuit 400*d* of the delay block 400 and the rising edge of the clock D_CLK0 from the delay circuit 400*a* of the delay block 400.

The delay path selector 220*d* sends the mask signal W4 to the delay cell 200*e* of the VCO 200, and asserts the mask signal W4 (raises to an H level) in response to an L to H level transition of the input data signal Data when this transition occurs between the rising edge of the clock D_CLK2 from the delay circuit 400*e* of the delay block 400 and the rising edge of the clock D_CLK3 from the delay circuit 400*b* of the delay block 400.

<Operation of clock recovery circuit>

As in Embodiment 1, the frequency of the reference clock RefCLK is set at one-fifth of the data rate of the input data signal Data, and thus the phase interval of the 5-phase clocks CLK0 to CLK4 from the VCO 200 is equal to the data width T defined by the data rate of the input data signal Data. Therefore, the delay amount in each of the delay cells 200*a* to 200*e* of the VCOs 200 and 234 is T/2.

In the clock recovery circuit of this embodiment, the delay amount td in the delay circuits 400*a* to 400*e* is feedback-controlled so that the phase difference between the output of the delay circuit 420*d* of the delay block 420 and the output of the delay cell 200*e* of the VCO 234 is zero. In other words, the delay amount td is controlled so that the delay amount (td+D) is T/2.

Figure 7:
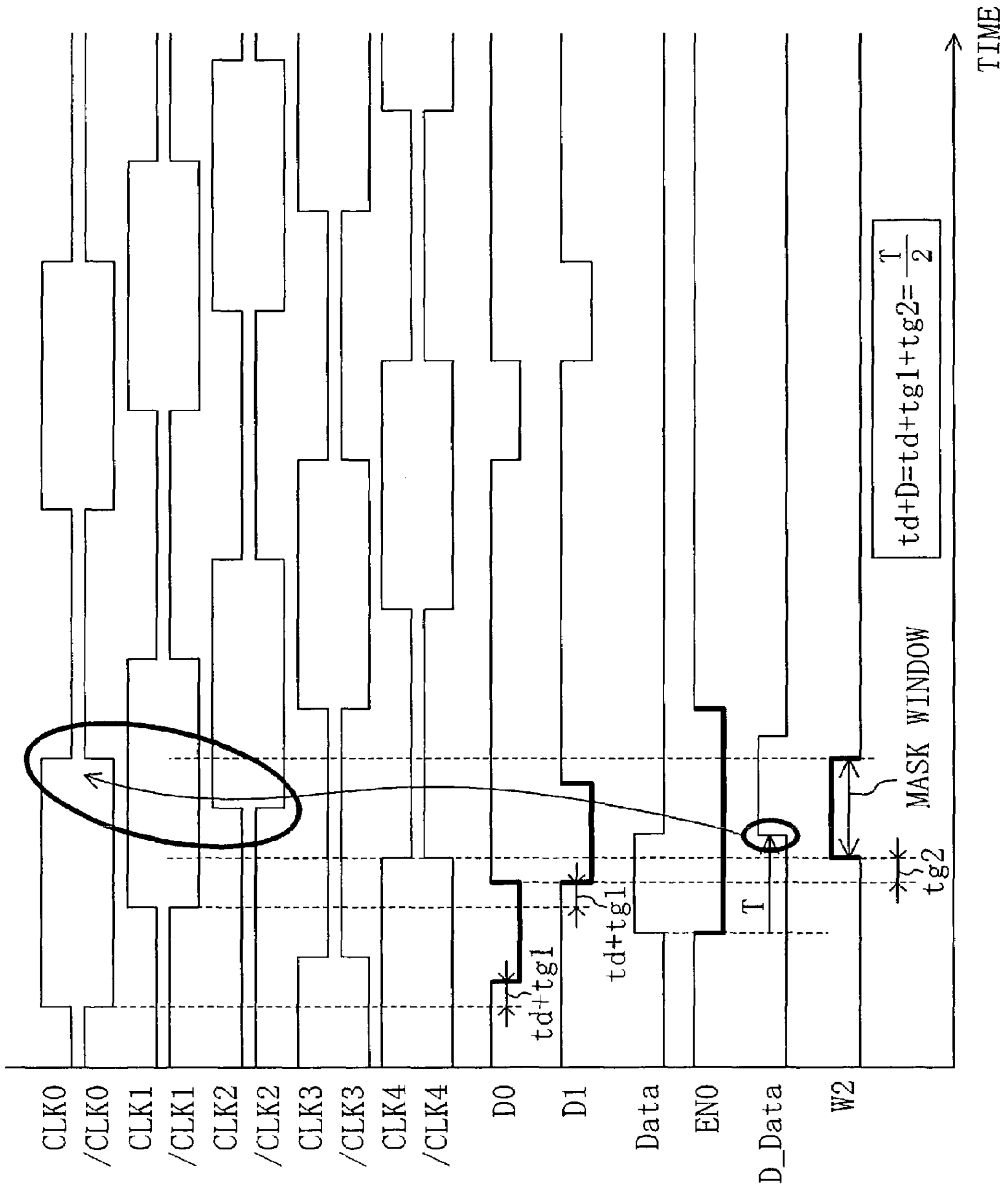
FIG. 7 is a timing chart showing the operation of the clock recovery circuit of FIG. 6.

By the control described above, as shown in FIG. 7, the mask window (W2 in the illustrated example) is generated so that a transition point of the clock to be replaced (CLK2 in the illustrated example) is located in the center.

<Effect>

The delay amount arising in the delay path selectors 220*a* to 220*e* during generation of the mask signals W0 to W4 is irrespective of the data rate of the input data signal Data. Therefore, if the data rate of the input data signal Data varies in a certain range, it is difficult to make an adjustment with a fixed delay so that the mask window is set at an optimum position for all data rates. However, in the clock recovery circuit of Embodiment 2, the delay amount td is feedback-controlled so that the delay amount (td+D) is T/2. This enables setting of the mask window at an optimum position irrespective of the data rate of the input data signal Data.

<Alterations>

In this embodiment, the delay amount td was feedback-controlled so that the delay amount (td+D) is T/2. The target value of the delay amount (td+D) is not limited to T/2, but may be an integral multiple of T/2 (T/2, T, 3T/2, . . . ) determined according to the data rate of the input data signal Data. In this case, the correspondence between the delay path selectors 220*a* to 220*e* and the delay cells 200*a* to 200*e* of the VCO 200 must be changed according to the determined target value of the delay amount (td+D).

The delay amount td in the delay circuits 400*a* to 400*e* may be discretely switched according to the data rate of the input data signal Data. For example, the delay circuits 400*a* to 400*e* may have a configuration shown in FIG. 8, in which three paths different in delay amount can be switched among one another according to signals SW1 to SW3 from a control circuit 460. The control circuit 460, which is provided in place of the phase comparator 430, the charge pump 440 and the low-pass filter 450 shown in FIG. 6, asserts one of the signals SW1 to SW3 according to the data rate of the input data signal Data. With this configuration, the delay amount td in the delay circuit 400*a* to 400*e* can be discretely switched according to the data rate of the input data signal Data.

For application to an interface having a plurality of input channels, the clock discovery circuit of FIG. 6 may be provided for each channel. To reduce the circuit area, however, the following arrangement may be adopted. The phase comparator 430, the charge pump 440 and the low-pass filter 450 for generation of the control signal CTL1 may be provided only for a clock recovery circuit for a certain channel. The control signal CTL1 generated in this clock recovery circuit may be supplied to and shared by the delay blocks 400 and 410 of clock recovery circuits for the other channels. By this arrangement, since only one set of the phase comparator 430, the charge pump 440 and the low-pass filter 450 are necessary for generation of the control signal CTL1, the circuit area can be reduced. From the standpoint of performance, also, the phase noise of the clocks from the VCO 234 is small because the input of each of the delay cells 200*a* to 200*e* of the VCO 234 is fixed to the output of the preceding delay cell. Therefore, the absolute accuracy of the position of the mask window is high.

Embodiment 3

<Configuration of clock recovery circuit>

Figure 9:
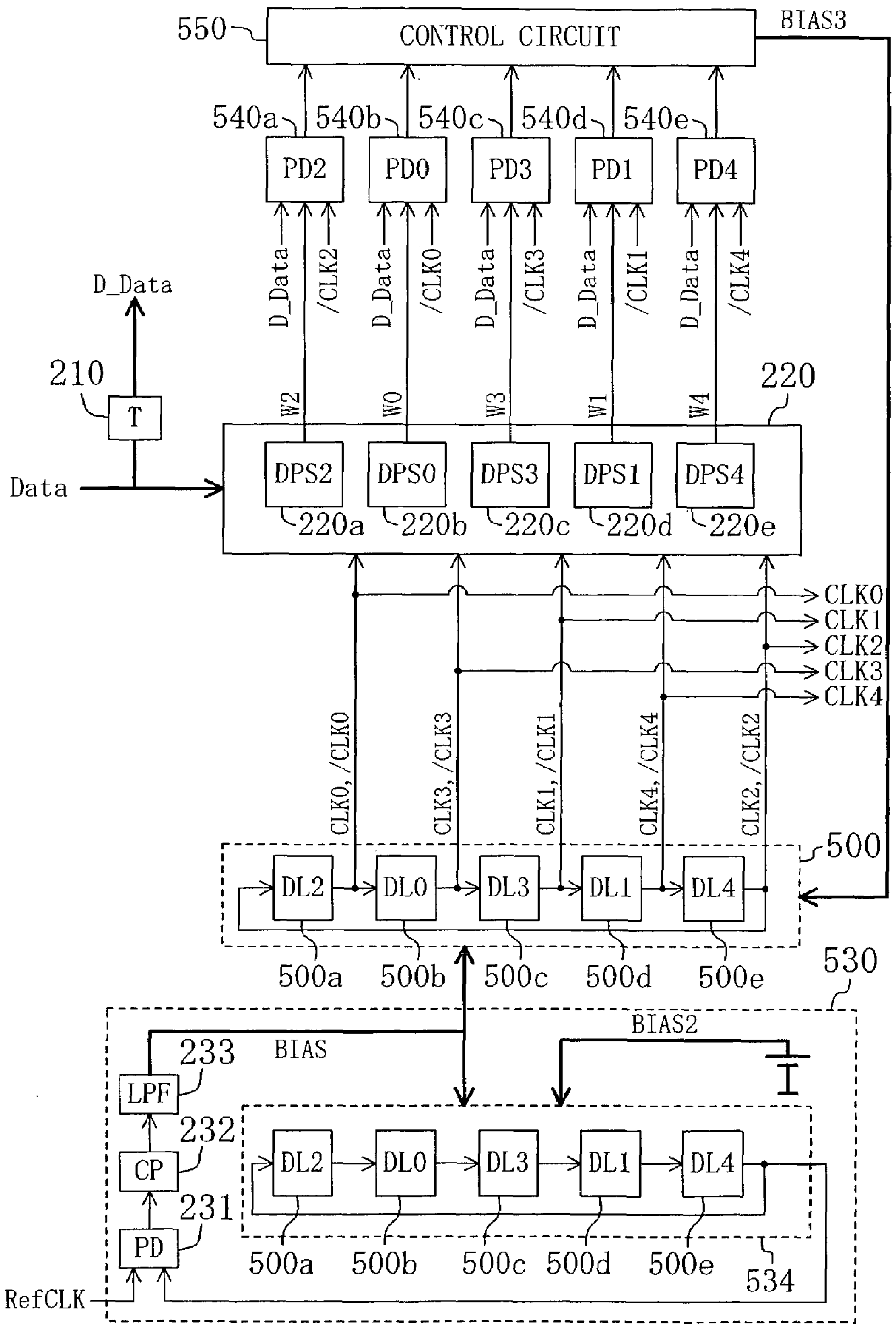
FIG. 9 is a block diagram of a clock recovery circuit of Embodiment 3 of the present invention.

FIG. 9 shows a configuration of a clock recovery circuit of Embodiment 3. The clock recovery circuit of this embodiment includes a delay circuit 210, an edge detector 220, a voltage-controlled oscillator (VCO) 500, a PLL 530, phase comparators 540*a* to 540*e* and a control circuit 550.

The VCO 500, oscillating at a frequency corresponding to a bias voltage BIAS from the PLL 530 and a bias voltage BIAS3 from the control circuit 550, includes 5-stage delay cells 500*a* to 500*e* connected in a ring. Each of the delay cells 500*a* to 500*e* reverse-delays a signal output from the preceding delay cell by a delay amount according to the bias voltage BIAS from the PLL 530 and the bias voltage BLAS3 from the control circuit 550. The outputs (CLK0, CLK3, CLK1, CLK4, CLK2) of the delay cells 500*a* to 500*e* are output outside the clock recovery circuit as multiphase clocks CLK0 to CLK4.

The PLL 530 includes a phase comparator 231, a charge pump 232, a low-pass filter 233 and a voltage-controlled oscillator (VCO) 534. The VCO 534 is identical in configuration to the VCO 500. That is, the VCO 534 includes 5-stage delay cells 500*a* to 500*e* connected in a ring. The delay cells 500*a* to 500*e* of the VCO 534 however reverse-delay the signals output from the respective preceding delay cells by a delay amount corresponding to the bias voltage BIAS from the low-pass filter 233 and a bias voltage BIAS2 of a fixed level. The level of the bias voltage BIAS2 is set at an intermediate voltage between the power supply voltage and the ground voltage.

The phase comparator 540*a* outputs an error signal corresponding to the phase difference between the rising edge of an input data signal D_Data from the delay circuit 210 and the rising edge of the output /CLK2 of the delay cell 500*e* of the VCO 500 when a mask signal W2 from the delay path selector 220*a* is active.

The phase comparator 540*b* outputs an error signal corresponding to the phase difference between the rising edge of the input data signal D_Data from the delay circuit 210 and the rising edge of the output /CLK0 of the delay cell 500*a* of the VCO 500 when a mask signal W0 from the delay path selector 220*b* is active.

The phase comparator 540*c* outputs an error signal corresponding to the phase difference between the rising edge of the input data signal D_Data from the delay circuit 210 and the rising edge of the output /CLK3 of the delay cell 500*b* of the VCO 500 when a mask signal W3 from the delay path selector 220*c* is active.

The phase comparator 540*d* outputs an error signal corresponding to the phase difference between the rising edge of the input data signal D_Data from the delay circuit 210 and the rising edge of the output /CLK1 of the delay cell 500*c* of the VCO 500 when a mask signal W1 from the delay path selector 220*d* is active.

The phase comparator 540*e* outputs an error signal corresponding to the phase difference between the rising edge of an input data signal D_Data from the delay circuit 210 and the rising edge of the output /CLK4 of the delay cell 500*d* of the VCO 500 when a mask signal W4 from the delay path selector 220*e* is active.

The control circuit 550 generates the bias voltage BIAS3 according to the error signals from the phase comparators 540*a* to 540*e*, and sends the bias voltage BIAS3 to the VCO 500.

<Internal configuration of delay cells 500*a* to 500*e*>

The internal configuration of the delay cells 500*a* to 500*e* of the VCO 500 shown in FIG. 9 will be described. Herein, the description is made taking the delay cell 500*a* as an example.

Figure 10:
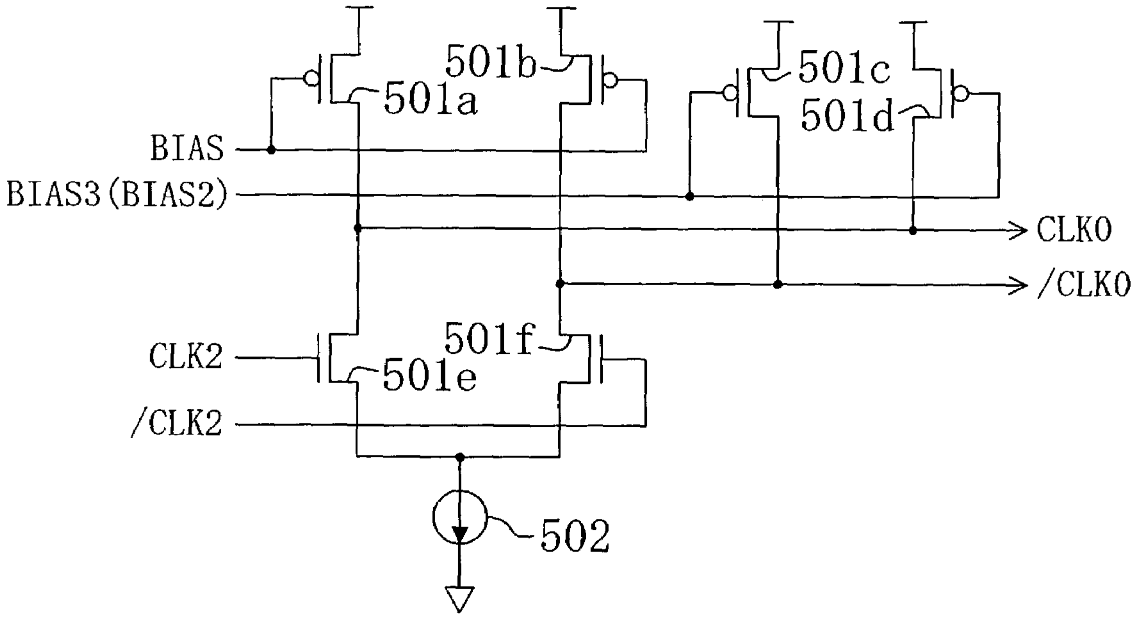
FIG. 10 is a view showing an internal configuration of a delay cell shown in FIG. 9.

As shown in FIG. 10, the delay cell 500*a* is a differential type voltage-controlled delay circuit, including P-channel MOS transistors 501*a* to 501*d*, N-channel MOS transistors 501*e* and 501*f* and a current source 502. The bias voltage BIAS from the low-pass filter 233 is applied to the gates of the P-channel MOS transistors 501*a* and 501*b*. The bias voltage BIAS3 from the control circuit 550 is applied to the gates of the P-channel MOS transistors 501*c* and 501*d*. The outputs CLK2 and /CLK2 of the preceding delay cell 500*e* are applied to the gates of the N-channel MOS transistors 501*e* and 501*f*, respectively. The delay cell 500*a* with the above configuration reverse-delays the outputs CLK2 and /CLK2 of the preceding delay cell 500*e* by a delay amount corresponding to the bias voltages BIAS and BIAS3, and outputs the resultant clocks as the clocks CLK0 and /CLK0.

The delay cells 500*b* to 500*c* of the VCO 500 have substantially the same internal configuration as the delay cell of FIG. 10. The delay cells 500*a* to 500*c* of the VCO 534 also have substantially the same internal configuration as the delay cell of FIG. 10, except that the fixed bias voltage BIAS2 is applied to the gates of the P-channel MOS transistors 501*c* and 501*d* in place of the bias voltage BLAS3.

In the illustrated example, the level of the bias voltage BIAS3 from the control circuit 550 is initialized to the level of the bias voltage BIAS2, so that the oscillating frequency of the VCO 500 is made equal to that of the VCO 534. Also, the frequency of the reference clock RefCLK is set at one-fifth of the data rate of the input data signal Data. By this setting, the phase interval of the 5-phase clocks CLK0 to CLK4 from the VCO 500 is equal to the data width defined by the data rate of the input data signal Data.

<Operation of clock recovery circuit>

Figure 11:
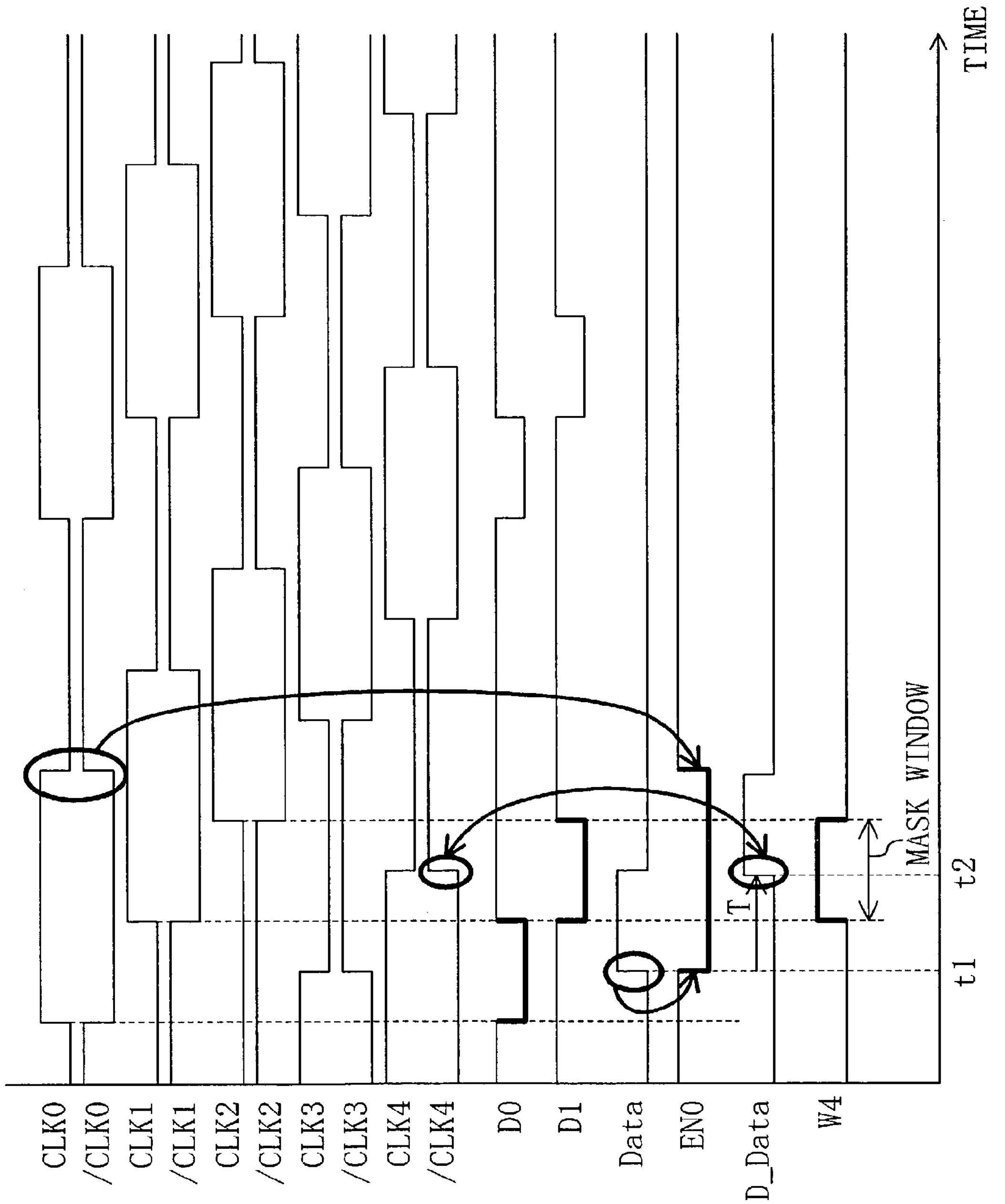
FIG. 11 is a timing chart showing the operation of the clock recovery circuit of FIG. 9.

The operation of the clock recovery circuit of FIG. 9 will be described with reference to FIG. 11.

As in Embodiment 1 described above, in response to the L to H level transition of the input data signal Data at time t1, the delay path selector 220*e* asserts the mask signal W4 (raises to an H level). The active period (mask window) of the mask signal W4 includes a transition point of the output CLK4 of the delay cell 500*d* preceding the delay cell 500*e*. At time t2, the input data signal D_Data from the delay circuit 210 makes an L to H level transition. The time t2 is included in the active period (mask window) of the mask signal W4.

The phase comparator 540*e*, activated in response to the active mask signal W4, compares the phase at the rising edge of the input data signal D_Data with the phase at the rising edge of the output /CLK4 of the preceding delay cell 500*d* and outputs an error signal corresponding to the comparison result. The control circuit 550 outputs the bias voltage BIAS3 of the level corresponding to the error signal from the phase comparator 540*e*. In this way, the phase relationship between the edges of the clocks CLK0 to CLK4 from the VCO 500 and the edge of the input data signal Data can be fixed. Thus, the multiphase clocks CLK0 to CLK4 synchronizing with the input data signal Data can be provided.

In the description described above, the input data signal Data made a transition during the period between the rising edge of the clock CLK0 and the rising edge of the clock CLK1 among the 5-phase clocks CLK0 to CLK4. The multiphase clocks CLK0 to CLK4 synchronizing with the input data signal Data can also be provided in other cases that the input data signal Data makes a transition during a period between other clock edges.

<Alterations>

Analog or digital control may be adopted for the control of the bias voltage BIAS3 by the control circuit 550.

A circuit for detecting frequency lock of the VCO 534 may be provided in addition to the configuration of FIG. 9, so that the edge detector 220 can start its operation after the VCO 534 is frequency-locked to stabilize the bias voltage BIAS for controlling the oscillating frequency of the VCL 534. In this case, the bias voltage BIAS2 is unnecessary and the bias voltage BIAS may be applied in place of the bias voltage BLAS2. The bias voltage BIAS3 is set at the same potential as the bias voltage BIAS until the VCO 534 is locked. After the VCO 534 is locked, the clock and data comparison is performed according to the mask signals W0 to W4 from the edge detector 220, and by the feedback of the comparison results, the bias voltage BIAS3 is controlled. By controlling in this way, setting is possible so that the phases of the clock edge and the data edge, compared with each other in a mask window, match with each other.

In the configuration of FIG. 9, the level of the bias voltage BIAS3 was initialized to the intermediate voltage and allowed to fluctuate vertically, to thereby enable forward/backward adjustment of the clocks CLK0 to CLK4. If a voltage-controlled delay circuit having a gain property reverse to that of the voltage-controlled delay circuit of FIG. 10 is placed on the data side, the data-clock relative phase difference can be advanced or retarded even when the initial potential of the bias voltage BIAS3 is at an end of a range. For example, when the initial potential of the bias voltage BIAS3 supplied to the VCO 500 is 0 V, only retardation is allowed for the voltage-controlled delay circuit of FIG. 10. If the voltage-controlled delay circuit having a reverse gain property described above is placed on the data side, the initial potential of the bias applied to a secondary frequency adjustment portion (corresponding to the P-channel MOS transistors 501*c* and 501*d* in FIG. 10) is set at a level permitting retardation. Thus, by retarding the data phase with the voltage-controlled delay circuit placed on the data side, the phases of the clocks CLK0 to CLK4 can be relatively advanced while the initial potential of the bias voltage BIAS3 applied to the VCO 500 remains 0 V.

Embodiment 4

Figure 12:
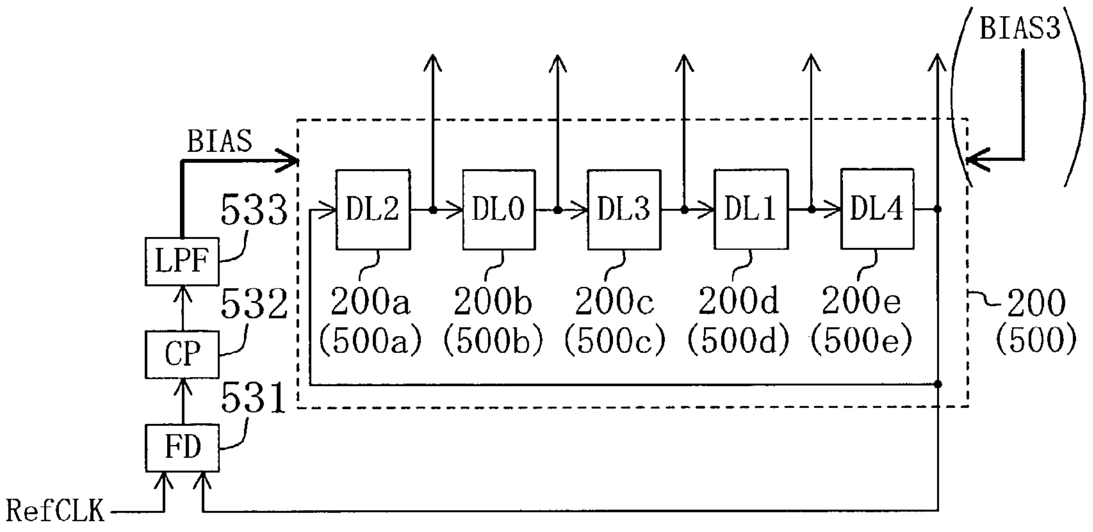
FIG. 12 is a block diagram of a frequency detection type PLL.

A clock recovery circuit of Embodiment 4 has the same configuration as the clock recovery circuit of FIG. 2 or FIG. 9, except that a frequency detector 531, a charge pump 532 and a low-pass filter 533 shown in FIG. 12 are provided in place of the PLL 230 shown in FIG. 2 or the PLL 530 shown in FIG. 9.

The frequency detector 531 outputs an error signal corresponding to the difference between the frequency of the reference clock RefCLK and the frequency of the output of the delay cell 200*e* (500*e*) of the VCO 200 (500). The charge pump 532 outputs a voltage corresponding to the error signal from the frequency detector 531. The low-pass filter 533 removes high frequency components of the voltage from the charge pump 532 and outputs the resultant voltage as the bias voltage BIAS.

The clock recovery circuit of this embodiment compares the reference clock RefCLK as the reference of the frequency with the oscillating frequency of the VCO 200 (500), and controls the bias voltage BIAS so that the oscillating frequency of the VCO 200 (500) is equal to the reference frequency.

The clock recovery circuit having the above configuration can also obtain substantially the same effect as that of the clock recovery circuit of FIG. 2 or FIG. 9.

Embodiment 5

Figure 13:
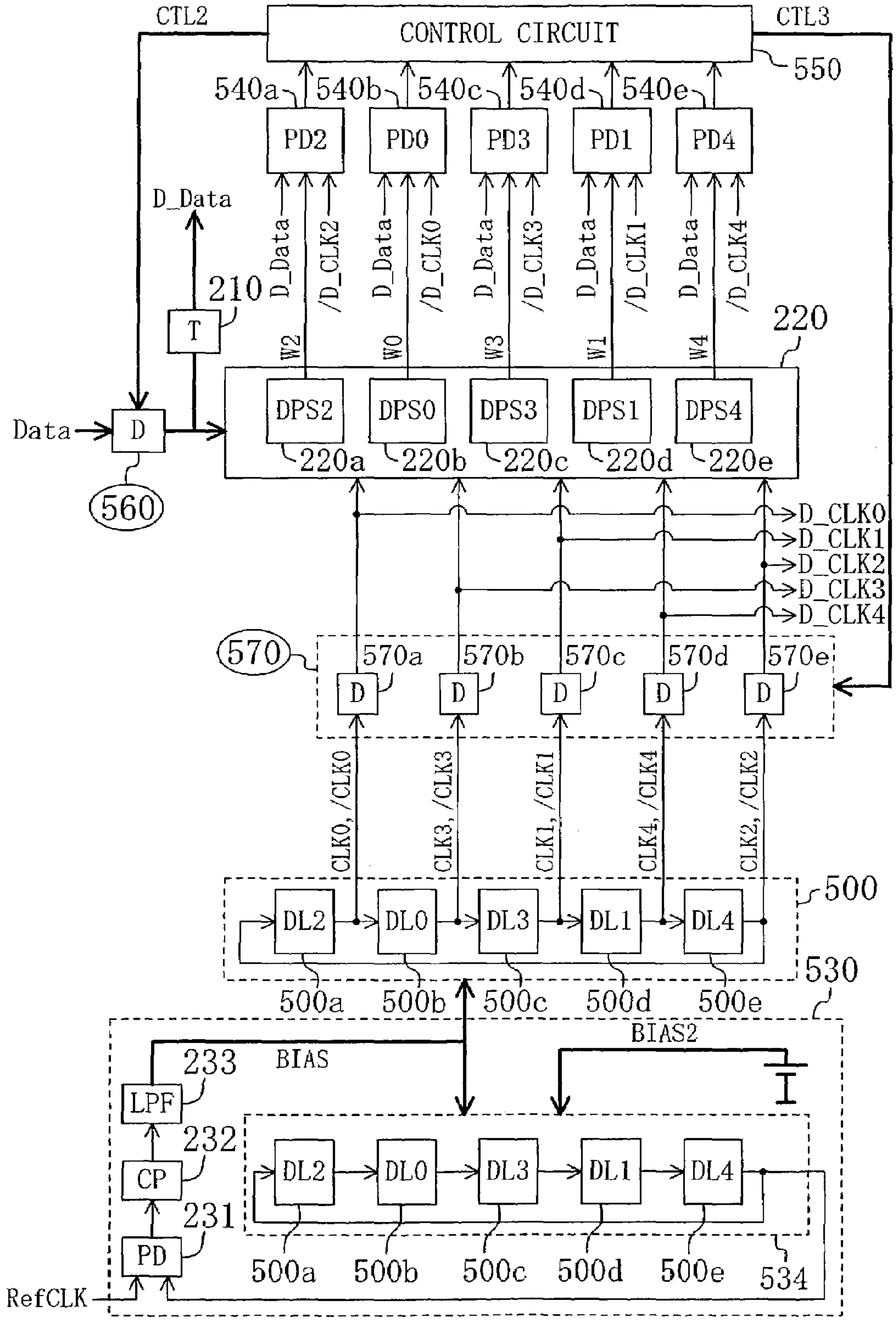
FIG. 13 is a block diagram of a clock recovery circuit of Embodiment 5 of the present invention.

FIG. 13 shows a-configuration of a clock recovery circuit of Embodiment 5. The clock recovery circuit of this embodiment further includes a delay circuit 560 and a delay block 570 in addition to the configuration of the clock recovery circuit shown in FIG. 9.

The delay circuit 560 delays the input data signal Data by a delay amount corresponding to a control signal CTL2 from the control circuit 550.

The delay block 570 includes delay circuits 570*a* to 570*e*, which delay the outputs of the delay cells 500*a* to 500*e* by a delay amount corresponding to a control signal CTL3 from the control circuit 550. The outputs of the delay circuits 570*a* to 570*e* (D_CLK0, D_CLK3, D_CLK1, D_CLK4 and D_CLK2) are supplied externally as multiphase clocks D_CLK0 to D_CLK4.

The delay circuit 210 receives an input data signal delayed by the delay circuit 560.

The edge detector 220 receives the input data signal from the delay circuit 560, in place of the input data signal Data, and also receives the multiphase clocks D_CLK0 to D_CLK4 including the delay added by the delay circuits 570*a* to 570*e*, in place of the multiphase clocks CLK0 to CLK4 from the VCO 500.

The phase comparators 540*a* to 540*e* receive clocks /D_CLK2, /D_CLK0, /D_CLK3, /D_CLK1 and /D_CLK4 from the delay block 570, in place of the clocks /CLK2, /CLK0, /CLK3, /CLK1 and /CLK4.

According to error signals (phase comparison results) from the phase comparators 540*a* to 540*e*, the control circuit 550 delays the phases of the clocks D_CLK0 to D_CLK4 by controlling the control signal CTL3 when the phases of the clocks /D_CLK0 to /D_CLK4 lead the phase of the data signal D_Data. Contrarily, the control circuit 550 delays the phase of the data signal D_Data by controlling the control signal CTL2 when the phase of the data signal D_Data leads. Thus, by controlling either one of the control signals CTL2 and CTL3, either the phases of the multiphase clocks D_CLK0 to D_CLK4 or the phase of the input data signal Data can be advanced or delayed with respect to the other. In this way, the phases of the multiphase clocks D_CLK0 to D_CLK4 are aligned with the phase of the input data signal Data.

Figure 8:
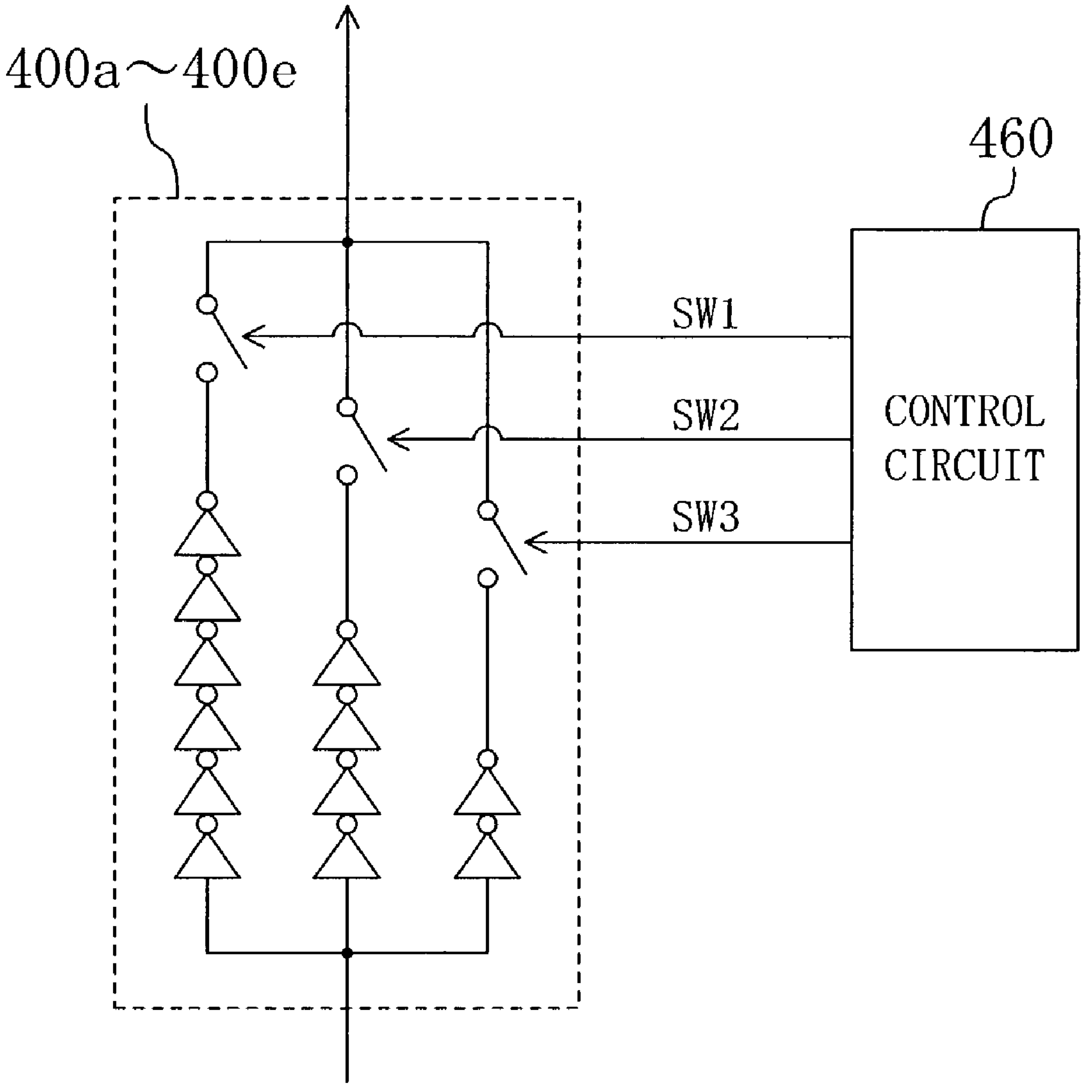
FIG. 8 is a view showing a configuration of a delay circuit of which the delay amount is set discretely.

In this embodiment, either one of the control signals CTL2 and CTL3 was controlled according to the phase difference. Alternatively, both the control signals CTL2 and CTL3 may be controlled. The control of the control signals CTL2 and CTL3 may be in an analog or digital manner. The delay circuits 560 and 570*a* to 570*e* may be configured as shown in FIG. 8 in which the delay amount is discretely set with control bits.

Embodiment 6

Figure 14:
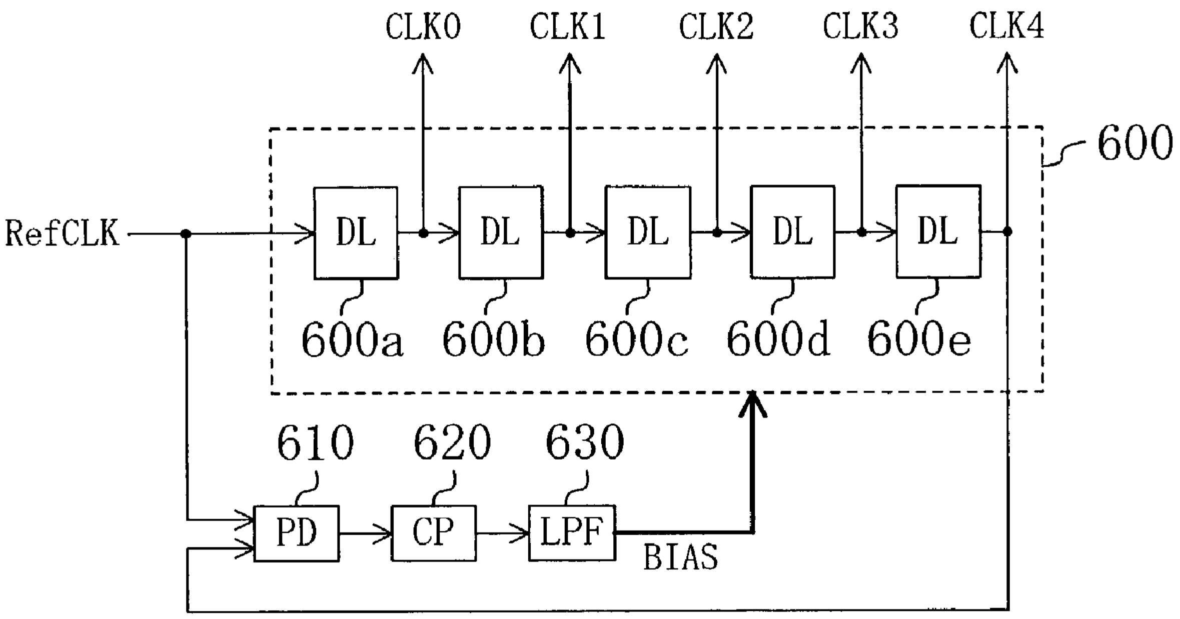
FIG. 14 is a block diagram of a DLL circuit.

A clock recovery circuit of Embodiment 6 has the same configuration as the clock recovery circuit of FIG. 9, except that a DLL circuit shown in FIG. 14 is provided in place of the VCO 500 and the PLL 530 shown in FIG. 9.

The DLL circuit of FIG. 14 includes a delay line 600, a phase comparator 610, a charge pump 620 and a low-pass filter 630.

The delay line 600 includes 5-stage delay cells 600*a* to 600*e* connected in series. Each of the delay cells 600*a* to 600*e* normally delays an input signal by a delay amount corresponding to the bias voltage BIAS from the low-pass filter 630. The first-stage delay cell 600*a* receives the reference clock RefCLK. The frequency of the reference clock RefCLK is set at one-fifth of the data rate of the input data signal Data.

The phase comparator 610 outputs an error signal corresponding to the phase difference between the output of the final-stage delay cell 600*e* and the reference clock RefCLK. The charge pump 620 outputs a voltage corresponding to the error signal from the phase comparator 610. The low-pass filter 630 removes high frequency components of the voltage from the charge pump 620 and outputs the resultant voltage as the bias voltage BIAS.

The DLL circuit in this embodiment compares the phases of the clock RefCLK before and after passing through the 5-stage delay cells 600*a* to 600*e*. Therefore, the sum of the delays in the 5-stage delay cells 600*a* to 600*e* is equal to one period of the reference clock RefCLK. Thus, the multiphase clocks CLK0 to CLK4 output from the DLL circuit have a phase interval equal to the data width defined by the data rate of the input data signal Data.

Embodiment 7

Figure 15:
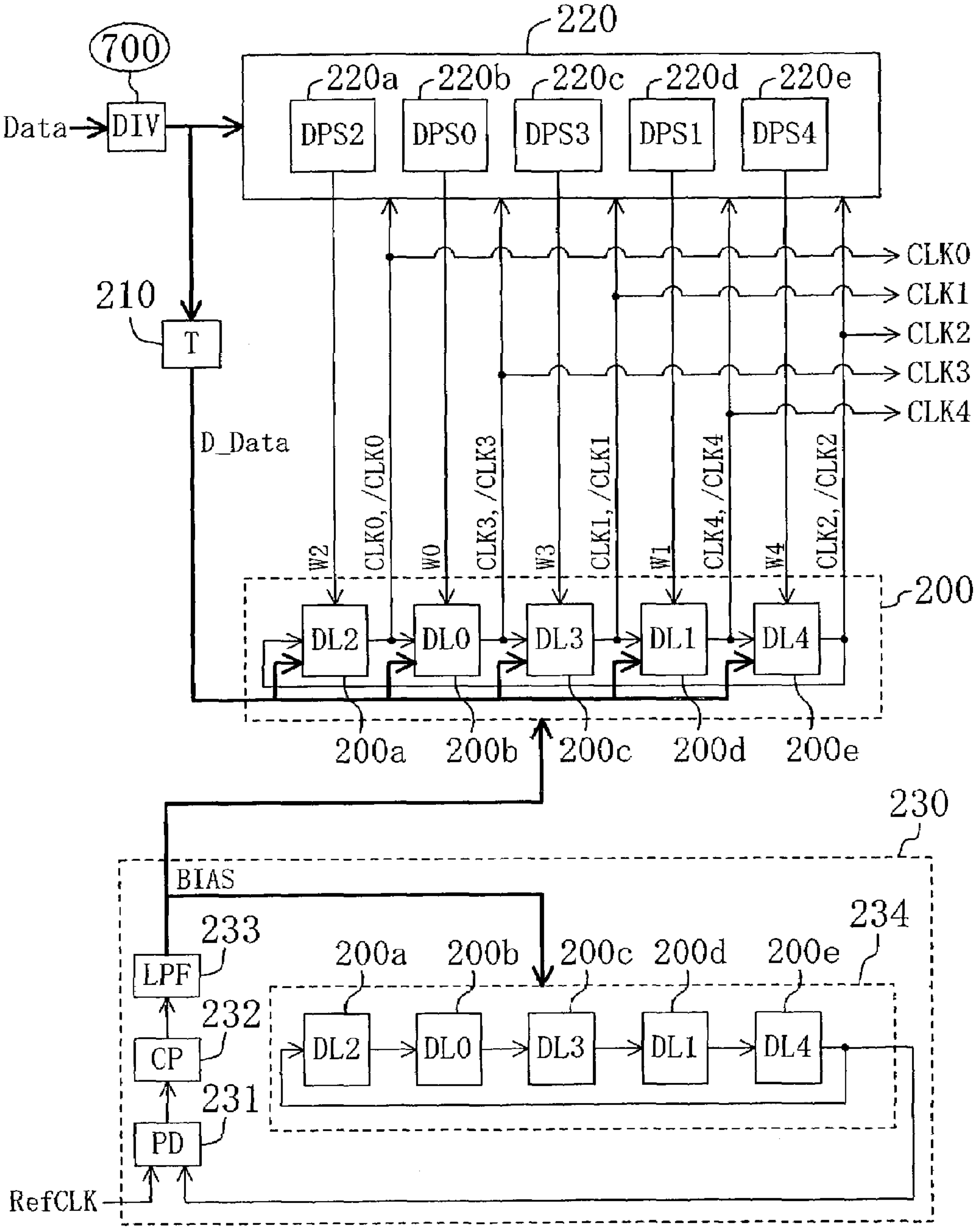
FIG. 15 is a block diagram of a clock recovery circuit of Embodiment 7 of the present invention.

FIG. 15 shows a configuration of a clock recovery circuit of Embodiment 7. The clock recovery circuit of this embodiment includes a frequency divider 700 in addition to the configuration of the clock recovery circuit of FIG. 2. The frequency divider 700, placed on a path through which the input data signal Data is sent to the edge detector 220 and the VCO 200, divides the frequency of the input data signal Data by two, so that the edges of the input data signal Data are thinned with every other edge being removed.

The edge-thinned input data signal is sent to the edge detector 220 and the VCO 200. The edge detector 220 detects two clocks, among the multiphase clocks CLK0 to CLK4, between the edges of which the edge-thinned input data signal has made a transition. According to the results of this detection, the edge detector 220 asserts one of the mask signals W0 to W4. Each of the delay cells 200*a* to 200*e* of the VCO 200 selects the signal output from the preceding delay cell or the input data signal D_Data from the delay circuit 210 (edge-thinned input data signal delayed by the delay T by the delay circuit 210) in response to the corresponding one of the mask signals W0 to W4 from the edge detector 220.

The phase of the input data signal D_Data (edge-thinned input data signal delayed by the delay T by the delay circuit 210) sent to the delay cells 200*a* to 200*e* of the VCO 200 is delayed from the phase of the original input data signal Data by the delays given by the frequency-divider 700 and the delay circuit 210. By adjusting the delay amount in the delay circuit 210, therefore, the data-clock phase relationship can be optimized.

The clock recovery circuit of FIG. 15 widens the data width of the input data signal sent to the delay circuit 210, and thus can reduce the inclination of the input data signal. Therefore, the inclination of the signal D_Data sent to the delay cells 200*a* to 200*e* of the VCO 200 can be made equal to the inclination of the outputs CLK0 to CLK4 of the delay cells 200*a* to 200*e*. As a result, the delay cells 200*a* to 200*e* are allowed to have the same delay characteristic irrespective of the input path, and thus the oscillating frequency of the VCO 200 is allowed to match with the data rate accurately.

In addition, the widened data width of the input data signal sent to the delay circuit 210 eases the high-speed requirement for the delay circuit 210. This makes it possible to reduce the drive capability of transistors constituting the delay circuit 210 and thus suppress power consumption.

The data width of the input data signal D_Data supplied to the delay cells 200*a* to 200*e* is also widened. This prevents the input data signal D_Data from making an unnecessary transition within a mask window, and thus the VCO 200 will be little affected adversely.

Although the divisor of the frequency division by the frequency divider 700 was two in this embodiment, it may be set at any number. Note however that with increase of the divisor, that is, increase of the thinning amount, information on the data transition time will decrease, and thus the resistance against a change in data phase will be traded off.

Figure 16:
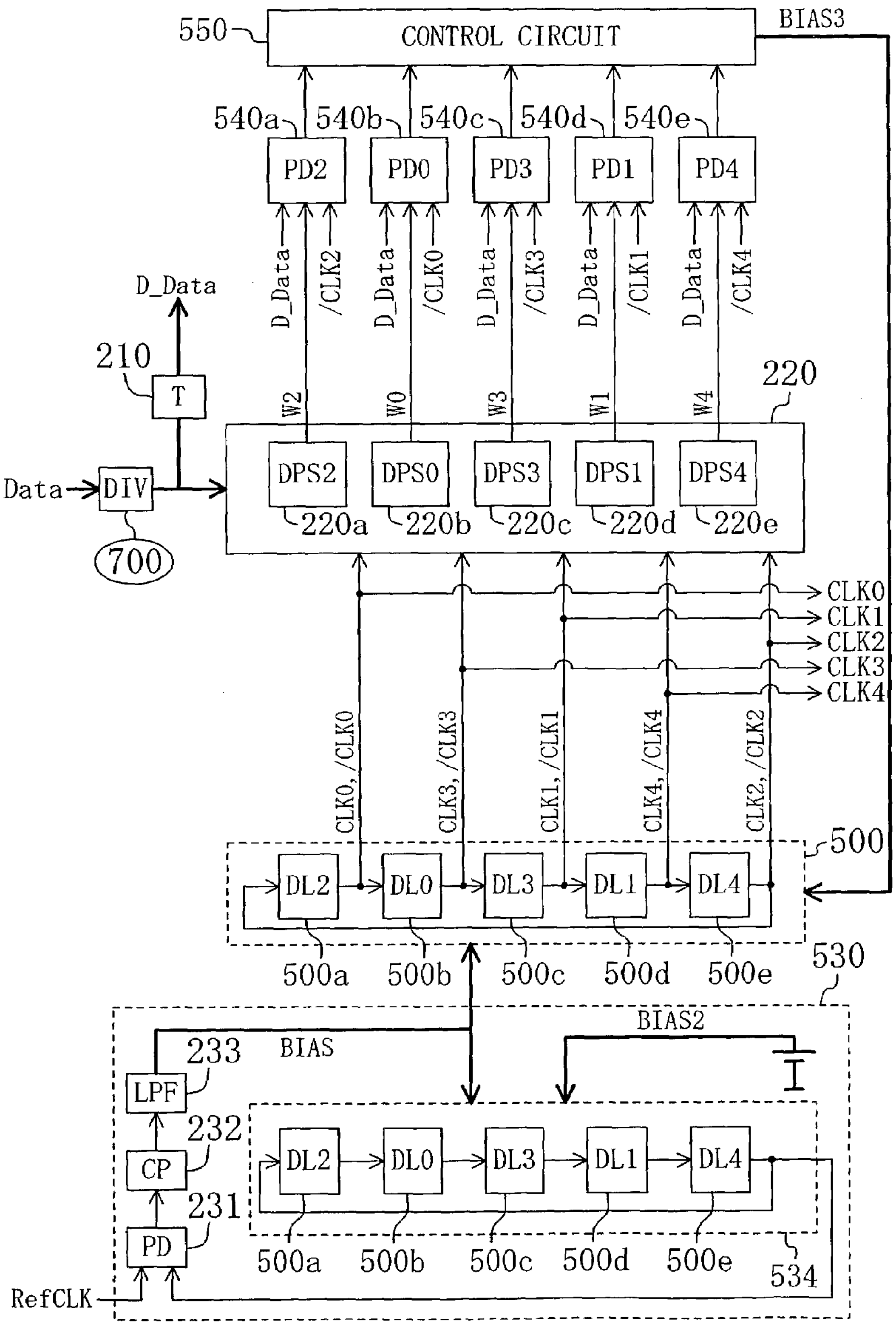
FIG. 16 is a block diagram of another clock recovery circuit of Embodiment 7 of the present invention.

The frequency divider 700 may be placed in addition to the configuration of the clock recovery circuit of FIG. 9, as shown in FIG. 16.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A clock recovery circuit comprising:

a first oscillator for generating a plurality of clocks having different phases and a predetermined frequency; and an edge detector for detecting two clocks, among the plurality of clocks, between edges of which an input data signal has made a transition, wherein the first oscillator includes a plurality of delay cells connected in a ring, outputs of the plurality of delay cells being output as the plurality of clocks, each of the plurality of delay cells selectively delays a first-delay added input data signal obtained by adding a first delay to the input data signal or the signal output from the preceding delay cell, and outputs the selected delayed signal, and the edge detector controls one delay cell among the plurality of delay cells corresponding to the result of the detection to delay the first-delay added input data signal and output the delayed signal.

2. The clock recovery circuit of claim 1, wherein the edge detector includes a plurality of delay path selectors provided to correspond to the plurality of delay cells, each of the delay path selectors outputs to the corresponding delay cell a mask signal asserted for a predetermined period in response to a transition of the input data signal if this transition occurs between edges of corresponding two clocks among the plurality of clocks, and each of the plurality of delay cells delays the first-delay added input data signal and outputs the delayed signal when the mask signal from the corresponding delay path selector is active.

3. The clock recovery circuit of claim 2, wherein the predetermined period includes: a transition point of the signal output from the delay cell preceding the delay cell corresponding to each of the plurality of delay path selectors; and a transition point of the first-delay added input data signal.

4. The clock recovery circuit of claim 2, wherein each of the plurality of delay path selectors includes a latch circuit, the latch circuit latches a pulse signal asserted between edges of two clocks corresponding to each of the plurality of delay path selectors, in response to an edge of the input data signal, and the latch circuit resets the latched signal in response to a reset signal, the reset signal being delayed by a predetermined phase from the edges of the two clocks.

5. The clock recovery circuit of claim 4, wherein the reset signal is synchronous with an edge of any clock among the plurality of clocks.

6. The clock recovery circuit of claim 2, further comprising:

a first delay circuit for adding a second delay to the plurality of clocks from the first oscillator; and a control circuit for controlling the delay amount of the second delay, wherein each of the plurality of delay path selectors outputs to the corresponding delay cell a mask signal asserted for a predetermined period in response to a transition of the input data signal if this transition occurs between edges of corresponding two clocks among the plurality of clocks with the second delay added by the first delay circuit.

7. The clock recovery circuit of claim 6, wherein the control circuit feedback-controls the delay amount of the second delay so that the phase difference between first and second clocks is a predetermined value, the first clock is obtained by adding the second delay and a third delay to one clock among the plurality of clocks from the first oscillator, the delay amount of the third delay includes a delay amount generated in one delay path selector among the plurality of delay path selectors, and the second clock is another clock among the plurality of clocks from the first oscillator.

8. The clock recovery circuit of claim 6, wherein the control circuit sets the delay amount of the second delay discretely according to the data rate of the input data signal.

9. The clock recovery circuit of claim 1, further comprising a PLL circuit, wherein the PLL circuit includes a second oscillator identical in configuration to the first oscillator, the second oscillator oscillates at a frequency corresponding to a first bias voltage, the PLL circuit feedback-controls the first bias voltage so that the oscillating frequency of the second oscillator is equal to a reference frequency, and the first oscillator oscillates at a frequency corresponding to the first bias voltage.

10. The clock recovery circuit of claim 9, wherein the edge detector includes a plurality of delay path selectors provided in correspondence with the plurality of delay cells of the first oscillator, each of the delay path selectors outputs to the corresponding delay cell a mask signal asserted for a predetermined period in response to a transition of the input data signal if this transition occurs between edges of corresponding two clocks among the plurality of clocks from the first oscillator, and each of the plurality of delay cells of the first oscillator delays the first-delay added input data signal and outputs the delayed signal when the mask signal from the corresponding delay path selector is active.

11. The clock recovery circuit of claim 10, further comprising:

a first delay circuit for adding a second delay to the plurality of clocks from the first oscillator and the plurality of clocks from the second oscillator; and a control circuit for controlling the delay amount of the second delay, wherein each of the plurality of delay path selectors outputs to the corresponding delay cell of the first oscillator a mask signal asserted for a predetermined period in response to a transition of the input data signal if this transition occurs between edges of corresponding two clocks among the plurality of clocks from the first oscillator with the second delay added by the first delay circuit.

12. The clock recovery circuit of claim 11, wherein the control circuit feedback-controls the delay amount of the second delay so that the phase difference between first and second clocks is a predetermined value, the first clock is obtained by adding the second delay and a third delay to one clock among the plurality of clocks from the second oscillator, the delay amount of the third delay includes a delay amount generated in one delay path selector among the plurality of delay path selectors, and the second clock is another clock among the plurality of clocks from the second oscillator.

13. The clock recovery circuit of claim 11, wherein the control circuit sets the delay amount of the second delay discretely according to the data rate of the input data signal.

14. The clock recovery circuit of claim 1, further comprising:

a frequency detector for comparing an oscillating frequency of the first oscillator with a reference frequency; and a control signal generator for outputting a control signal corresponding to the result of the comparison by the frequency detector, wherein the first oscillator oscillates at a frequency corresponding to the control signal from the control signal generator.

15. The clock recovery circuit of claim 1, further comprising a thinning section for thinning edges of the input data signal, wherein the edge detector detects two clocks, among the plurality of clocks, between edges of which the input data signal edge-thinned by the thinning section has made a transition, each of the plurality of delay cells selectively delays a first-delay added input data signal edge-thinned by the thinning section or the signal output from the preceding delay cell, and outputs the selected delayed signal, and the edge detector controls one delay cell among the plurality of delay cells corresponding to the result of the detection to delay the first-delay added input data signal edge-thinned by the thinning section and output the delayed signal.

16. The clock recovery circuit of claim 15, wherein the thinning section includes a frequency divider for dividing the frequency of the input data signal.

17. A clock recovery circuit comprising:

a multiphase clock generator for generating a plurality of clocks having different phases and a predetermined frequency;

an edge detection section for detecting two clocks, among the plurality of clocks, between edges of which an input data signal has made a transition;

a phase comparison section for comparing the phase of one clock among the plurality of clocks corresponding to the result of the detection by the edge detection section with the phase of a first-delay added input data signal obtained by adding a first delay to the input data signal; and a control circuit for controlling the phases of the plurality of clocks according to the result of the comparison by the phase comparison section.

18. The clock recovery circuit of claim 17, wherein the edge detection section includes a plurality of detection circuits, the phase comparison section includes a plurality of phase comparators provided to correspond to the plurality of detection circuits, each of the plurality of detection circuits outputs to the corresponding phase comparator a mask signal asserted for a predetermined period in response to a transition of the input data signal if this transition occurs between edges of corresponding two clocks among the plurality of clocks, and each of the plurality of phase comparators compares the phase of the corresponding clock among the plurality of clocks with the phase of the first-delay added input data signal.

19. The clock recovery circuit of claim 18, wherein each of the plurality of detection circuits includes a latch circuit, the latch circuit latches a pulse signal asserted between edges of the corresponding two clocks in response to an edge of the input data signal, and the latch circuit resets the latched signal in response to a reset signal, the reset signal being delayed by a predetermined phase from the edges of the corresponding two clocks.

20. The clock recovery circuit of claim 19, wherein the reset signal is synchronous with an edge of any clock among the plurality of clocks.

21. The clock recovery circuit of claim 17, wherein the multiphase clock generator includes a first oscillator, and the first oscillator includes a plurality of delay cells connected in a ring, outputs of the plurality of delay cells being output as the plurality of clocks.

22. The clock recovery circuit of claim 21, further comprising a PLL circuit, wherein the PLL circuit includes a second oscillator identical in configuration to the first oscillator, the second oscillator oscillates at a frequency corresponding to a first bias voltage and a second bias voltage, the PLL circuit feedback-controls the first bias voltage so that the oscillating frequency of the second oscillator is equal to a reference frequency, the control circuit outputs a third bias voltage corresponding to the result of the comparison by the phase comparison section, and the first oscillator oscillates at a frequency corresponding to the first bias voltage and the third bias voltage.

23. The clock recovery circuit of claim 22, wherein the second bias voltage is set at an intermediate voltage between the supply voltage and the ground voltage.

24. The clock recovery circuit of claim 21, further comprising:

a frequency detector for comparing an oscillating frequency of the first oscillator with a reference frequency, and a control signal generator for outputting a control signal corresponding to the result of the comparison by the frequency detector, wherein the first oscillator oscillates at a frequency corresponding to the control signal from the control signal generator.

25. The clock recovery circuit of claim 17, further comprising:

a first delay circuit for adding a second delay to the input data signal; and a second delay circuit for adding a third delay to the plurality of clocks from the multiphase clock generator, wherein the edge detection section detects two clocks, among the plurality of third-delay added clocks, between edges of which the second-delay added input data signal has made a transition, the phase comparison section compares the phase of one clock among the plurality of third-delay added clocks corresponding to the result of the detection by the edge detector with the phase of a signal obtained by adding the first delay and the second delay to the input data signal; and the control circuit controls the delay amount of the second delay and/or the delay amount of the third delay according to the result of the comparison by the phase comparison section.

26. The clock recovery circuit of claim 17, wherein the multiphase clock generator includes a plurality of stages of delay cells and a delay control section, outputs of the plurality of stages of delay cells being output as the plurality of clocks, a reference clock is supplied to an input of the first-stage delay cell among the plurality of stages of delay cells, and the delay control section compares the phase of the output of the final-stage delay cell among the plurality of stages of delay cells with the reference clock, and controls the delay amount of the plurality of stages of delay cells according to the result of the comparison.

27. The clock recovery circuit of claim 17, further comprising a thinning section for thinning edges of the input data signal, wherein the edge detection section detects two clocks, among the plurality of clocks, between edges of which the input data signal edge-thinned by the thinning section has made a transition, and the phase comparison section compares the phase of one clock among the plurality of clocks corresponding to the result of the detection by the edge detection section with the phase of a first-delay added input data signal edge-thinned by the thinning section.

28. The clock recovery circuit of claim 27, wherein the thinning section includes a frequency divider for dividing the frequency of the input data signal.

* * * * *